United States Patent
Endo et al.

(10) Patent No.: US 6,826,844 B2
(45) Date of Patent: Dec. 7, 2004

(54) DOWNSIZED SENSOR UNIT WITH INCREASED ACCURACY

(75) Inventors: Michiko Endo, Shinagawa (JP);
Katsuya Funakoshi, Shinagawa (JP);
Takashi Arita, Shinagawa (JP);
Masayuki Kato, Shinagawa (JP);
Shinichiro Akieda, Shinagawa (JP)

(73) Assignee: Nagano Fujitsu Component Limited, Nagano (JP)

(*) Notice: Subject to any disclaimer, the term of this patent is extended or adjusted under 35 U.S.C. 154(b) by 0 days.

(21) Appl. No.: 10/101,831

(22) Filed: Mar. 21, 2002

(65) Prior Publication Data

US 2002/0144418 A1 Oct. 10, 2002

(30) Foreign Application Priority Data

Apr. 9, 2001 (JP) ........................................ 2001-110513
Jan. 9, 2002 (JP) ........................................ 2002-002251

(51) Int. Cl.[7] ................................................. G01C 9/12
(52) U.S. Cl. ...................................... 33/366.24; 33/391
(58) Field of Search ......................... 33/366.11, 366.12, 33/366.24, 366.25, 366.26, 390, 391, 397

(56) References Cited

U.S. PATENT DOCUMENTS

| | | | | |
|---|---|---|---|---|
| 5,365,671 A | * | 11/1994 | Yaniger | 33/366.12 |
| 5,917,587 A | * | 6/1999 | Rando | 356/149 |
| 6,139,053 A | * | 10/2000 | Knox | 280/735 |
| 6,301,795 B1 | * | 10/2001 | Kang | 33/366.12 |
| 6,341,428 B1 | * | 1/2002 | Tanazawa et al. | 33/366.24 |
| 6,470,580 B1 | * | 10/2002 | Ushihara et al. | 33/391 |
| 6,543,147 B2 | * | 4/2003 | Akieda | 33/366.24 |
| 6,622,570 B1 | * | 9/2003 | Prevey, III | 73/826 |

FOREIGN PATENT DOCUMENTS

| | | |
|---|---|---|
| JP | 1-145573 | 6/1989 |
| JP | 8-152321 | 6/1996 |
| JP | 9-101323 | 4/1997 |
| JP | 10-176926 | 6/1998 |
| JP | 2000-180160 | 6/2000 |

* cited by examiner

Primary Examiner—G. Bradley Bennett
(74) Attorney, Agent, or Firm—Staas & Halsey LLP

(57) ABSTRACT

A sensor unit includes a support body having a concave surface, a spherical body formed of a magnetic material and placed on the concave surface of the support body so as to roll freely thereon, a permanent magnet producing a magnetic field affecting the magnetic spherical body, and a magnetic sensor detecting a change in the magnetic field caused by the movement of said magnetic spherical body. The magnetic spherical body and the permanent magnet are provided to oppose each other with a given distance therebetween in a vertical direction. The magnetic sensor is provided between the magnetic spherical body and the permanent magnet. An output is produced in accordance with the detection by the magnetic sensor.

39 Claims, 37 Drawing Sheets

DOWNSIZED SENSOR UNIT WITH INCREASED ACCURACY

BACKGROUND OF THE INVENTION

1. Field of the Invention

The present invention generally relates to sensor units, and more particularly to a sensor unit composed of a permanent magnet, a spherical body formed of a magnetic material, and a magnetic sensor and used for inclination and acceleration measurement.

The sensor units are employed in automobiles, game controllers, and projectors. The sensor units are preferably small in size and easy to incorporate into apparatuses.

2. Description of the Related Art

FIG. 1 is a diagram showing a sensor unit 10 disclosed in Japanese Laid-Open Patent Application No. 2000-180160. The sensor unit 10 includes a spherical body 13 formed of a magnetic material and supported on a spherically concave partition wall 12 in the center of a container 11. The sensor unit 10 also has a permanent magnet 15 fixed to a bottom plate 14 of the container 11 and a Hall element 17 fixed to the bottom surface of a top plate 16 of the container 11. The permanent magnet 15 generates a first magnetic field indicated by lines of magnetic force 18. The magnetic spherical body 13 is magnetized by the first magnetic field so as to generate a second magnetic field indicated by lines of magnetic force 19. The second magnetic field affects the Hall element 17 so that the Hall element 17 outputs voltage.

The sensor unit 10 has a height ho indicated by an arrow in FIG. 1. In the sensor unit 10, in the direction of the height thereof, the magnetic spherical body 13 is positioned in the center, the permanent magnet 15 is positioned below the magnetic spherical body 13, and the Hall element 17 is positioned above the magnetic spherical body 13.

The sensor unit 10, for instance, is mounted in an electronic apparatus such as a vehicle or a projector. When the apparatus is inclined, the magnetic spherical body 13 rolls on the partition wall 12 so as to change position with respect to the permanent magnet 15 and the Hall element 17. Thereby, a change is effected in the second magnetic field affecting the Hall element 17 so as to vary the output voltage thereof. The angle and direction of inclination of the electronic apparatus is detected based on the variation in the output voltage of the Hall element 17.

In the above-described sensor unit 10, especially, the Hall element 17 is provided above the magnetic spherical body 13. Therefore, a part above the magnetic spherical body 13 takes up much space so that the height ho of the sensor unit 10 is required to be large, thereby making it difficult to downsize the sensor unit 10.

Further, in a normal sensor unit, a Hall element is mounted on a printed board, being electrically connected with pads on the printed board. However, in the sensor unit 10, the Hall element 17 is provided in an upper part of the sensor unit 10, thus complicating a route of extension of interconnection lines from the Hall element 17.

SUMMARY OF THE INVENTION

Accordingly, it is a general object of the present invention to provide a sensor unit in which the above-described disadvantage is eliminated.

A more specific object of the present invention is to provide a sensor unit reduced in size and assembled with ease.

Another more specific object of the present invention is to provide a sensor unit performing detection with increased accuracy.

The above objects of the present invention are achieved by a sensor unit including a support body having a concave surface, a spherical body formed of a magnetic material and placed on the concave surface of the support body so as to roll freely thereon, a permanent magnet producing a magnetic field affecting the magnetic spherical body, and a magnetic sensor detecting a change in the magnetic field caused by the movement of the magnetic spherical body, wherein the magnetic spherical body and the permanent magnet are provided to oppose each other with a given distance therebetween in a vertical direction, the magnetic sensor is provided between the magnetic spherical body and the permanent magnet, and an output is produced in accordance with the detection by the magnetic sensor.

According to the above-described sensor unit, the magnetic sensor is provided by using a space between the magnetic spherical body and the permanent magnet provided to oppose each other with the given distance therebetween. Therefore, no additional space is required for providing the magnetic sensor. Accordingly, the sensor unit is downsized with a reduced height.

The above objects of the present invention are also achieved by a sensor unit including a support body having a concave surface, a spherical body formed of a magnetic material and placed on the concave surface of the support body so as to roll freely thereon, a permanent magnet producing a magnetic field affecting the magnetic spherical body, a magnetic sensor detecting a change in the magnetic field caused by the movement of the magnetic spherical body, and a printed board having first and second opposing surfaces, wherein the magnetic sensor is provided to the first surface of the printed board, the support body is fixed to the first surface of the printed board, the permanent magnet is fixed to the second surface of the printed board, and an output is produced in accordance with the detection by the magnetic sensor.

According to the above-described sensor unit, the magnetic sensor is provided by using a space between the magnetic spherical body and the permanent magnet provided to oppose each other with a given distance therebetween. Therefore, no additional space is required for providing the magnetic sensor. Accordingly, the sensor unit is downsized with a reduced height.

Additionally, the above-described sensor unit may include a Hall element for temperature compensation, the Hall element being provided to a surface of the permanent magnet on a side opposite to the printed board.

Thereby, temperature compensation is provided to the magnetic sensor and the permanent magnet, thus increasing detection accuracy.

The above objects of the present invention are also achieved by a sensor unit including a case, a printed board having a magnetic sensor provided thereto, a hanging member including a permanent magnet producing a magnetic field, and a hanging and support mechanism that hangs and supports the hanging member in the case so that the hanging member is allowed to swing while being restricted in displacement in a vertical direction, wherein the magnetic sensor detects a change in the magnetic field caused by a movement of the permanent magnet due to the displacement of the hanging member so that an output is produced in accordance with the detection by the magnetic sensor.

According to the above-described sensor unit, the hanging and support mechanism restricts displacement of the hanging member in the vertical direction so that no change is caused in the output even when vibration or impact is exerted on the sensor unit in the vertical direction. Therefore, the sensor unit has good impact resistance, thus assuring good detection accuracy.

The above objects of the present invention are also achieved by a sensor unit including a case, a printed board having a magnetic sensor provided thereto, a balancing assembly having a permanent magnet producing a magnetic field, and a pivot support mechanism that supports the balancing assembly in the case so that the balancing assembly is allowed to swing, wherein the magnetic sensor detects a change in the magnetic field caused by a movement of the permanent magnet due to the displacement of the balancing assembly with respect to the printed board so that an output is produced in accordance with the detection by the magnetic sensor.

The above-described sensor unit is reduced in size and easy to assemble.

Additionally, the above-described sensor unit may include a detection switch provided in the case so as to oppose the top part of the balancing assembly, and the detection switch may detect an upward displacement of the balancing assembly to make the output of the sensor unit invalid.

The detection accuracy of the sensor unit decreases with the balancing assembly being in an upward displaced state. Therefore, the detection switch makes less accurate data invalid so that only highly accurate data is output from the sensor unit.

Additionally, the above-described sensor unit may include a part that affects the permanent magnet of the balancing assembly so that a flotation force is magnetically exerted on the balancing assembly.

Since the flotation force is exerted on the balancing assembly, frictional force is reduced between the balancing assembly and the pivot support mechanism, thus increasing the swing sensitivity of the balancing assembly.

The above objects of the present invention are also achieved by a sensor unit including a swing part including a swingable magnet, electromagnetic transducers detecting magnetism of the magnet, and a magnetic shield member shutting off a magnetic effect on the magnet.

According to the above-described sensor unit, the magnet is magnetically shielded so that magnetic interaction between the magnet and an external magnetic material can be reduced. Therefore, the sensor unit can perform detection with increased accuracy.

The above objects of the present invention are also achieved by a sensor unit including a swing part including a swingable magnet, electromagnetic transducers detecting magnetism of the magnet, a case having a spherical internal surface substantially centered on a pivot center of the swing part and accommodating the swing part, and a magnetic shield member provided to the spherical internal surface of the case.

According to the above-described sensor unit, the magnetic material is provided to the spherical internal surface of the case so that the magnet can be magnetically shielded with a constant distance being maintained between the magnet and the magnetic material.

The above objects of the present invention are further achieved by a sensor unit including a swing part including a swingable magnet, electromagnetic transducers detecting magnetism of the magnet, a case accommodating the swing part, and an elastic force application part applying an elastic force to the swing part.

According to the above-described sensor unit, the elastic force is applied to the swing part so that displacement of the swing part is reduced with respect to, for instance, acceleration, thus enlarging the detectable range of acceleration.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description will now be given, with reference to the accompanying drawings, of embodiments of the present invention.

First Embodiment

Figure 2:
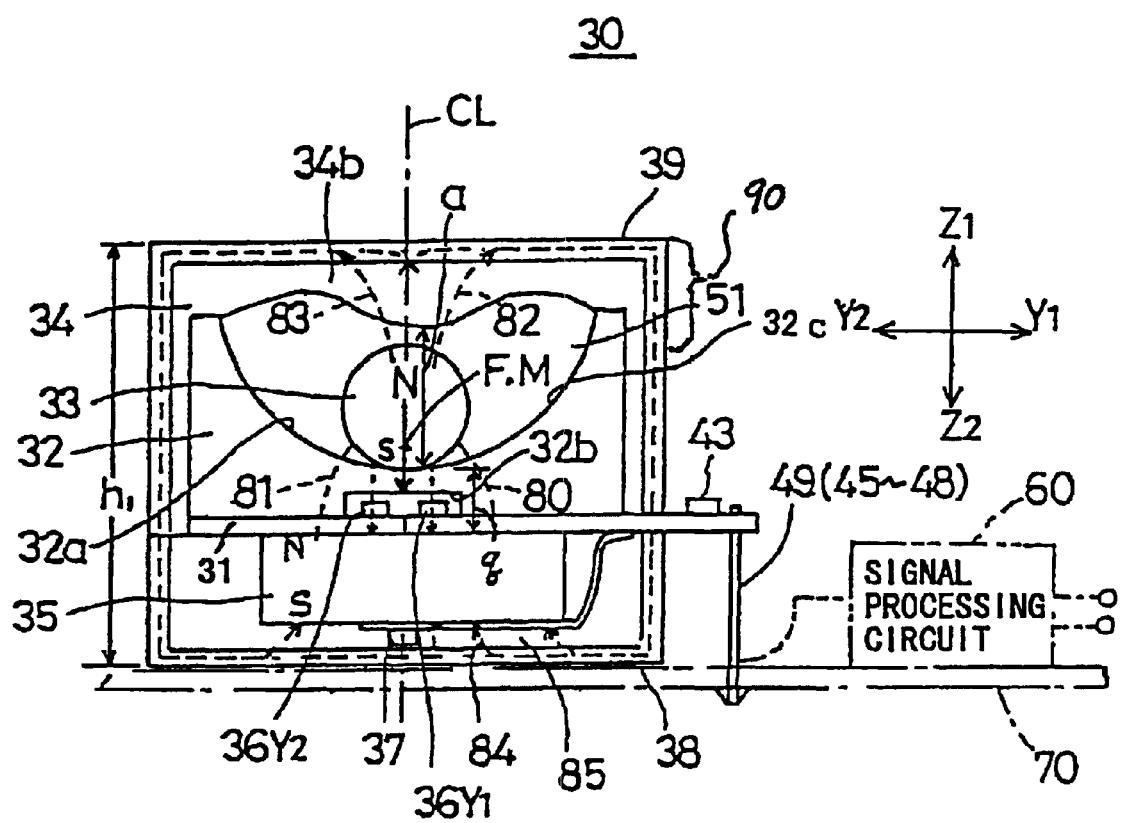
FIG. 2 is a sectional view of a sensor unit according to a first embodiment of the present invention.
Figure 3:
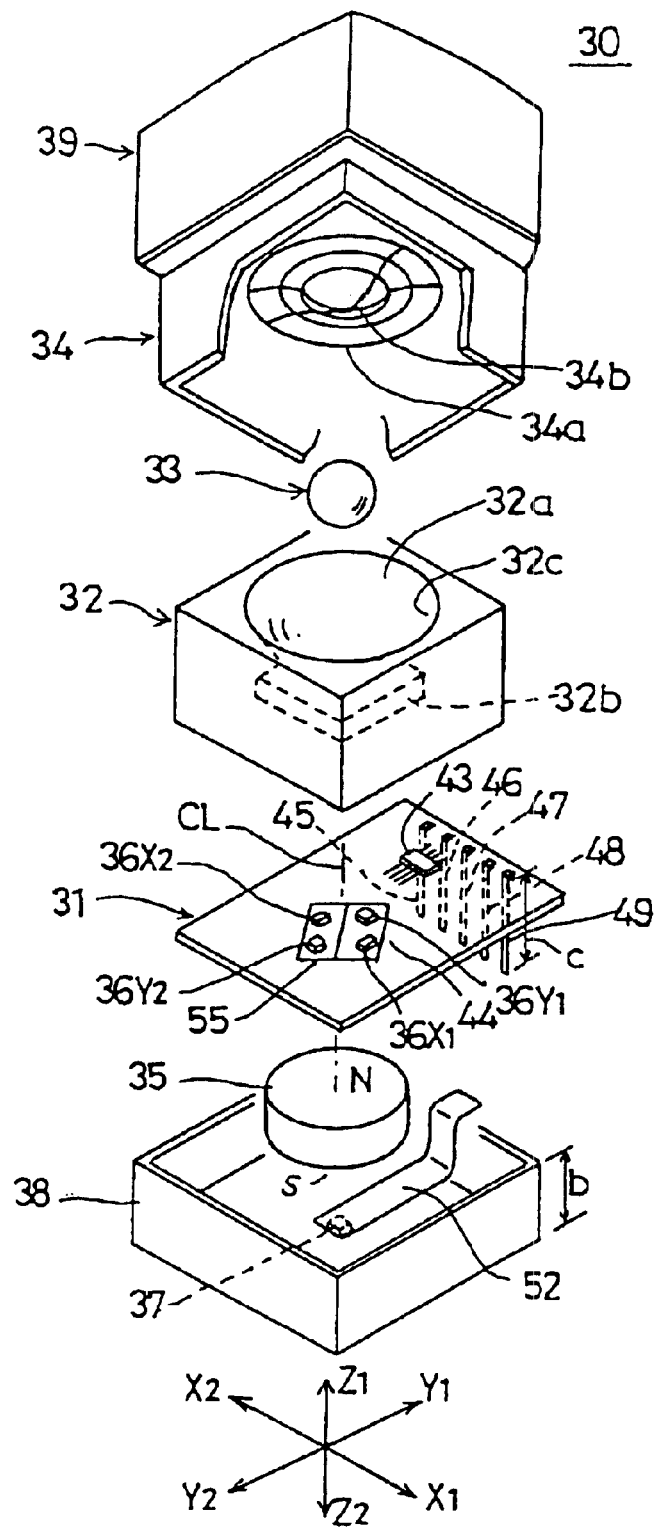
FIG. 3 is an exploded perspective view of the sensor unit of FIG. 2.
Figure 4:
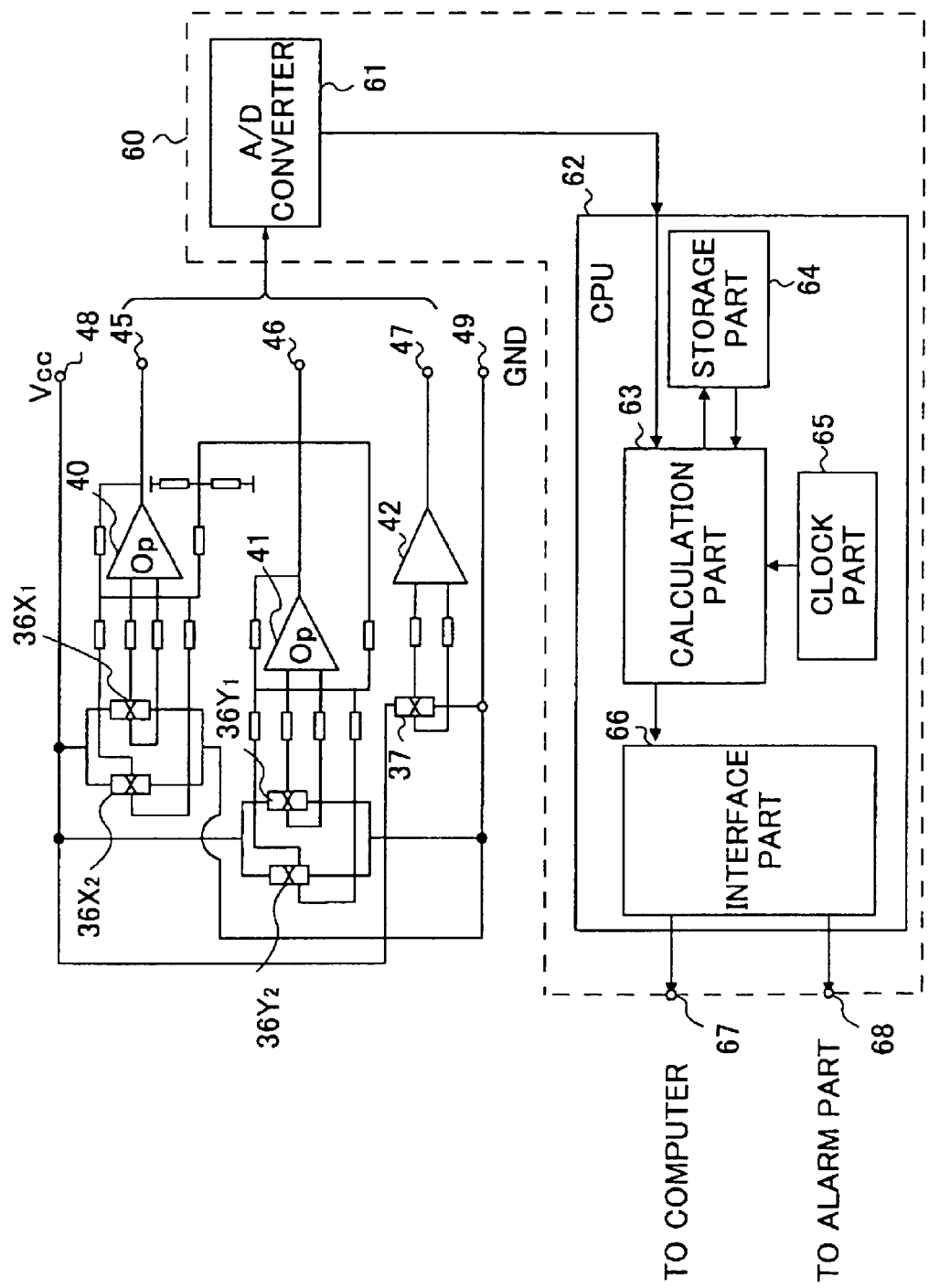
FIG. 4 is a diagram showing a circuit of the sensor unit of FIG. 2 and an electronic circuit of an apparatus in which the sensor unit of FIG. 2 is mounted.

FIG. 2 is a sectional view of a sensor unit 30 according to a first embodiment of the present invention. FIG. 3 is an exploded perspective view of the sensor unit of FIG. 2. The sensor unit 30 has a suitable structure for inclination detection. FIG. 4 is a diagram showing an electrical circuit 50 provided in the sensor unit 30 and a signal processing circuit 60 formed on a printed board 70 on which the sensor unit 30 is mounted.

In FIGS. 2 and 3, $X_1$–$X_2$ represents the width directions, $Y_1$–$Y_2$ represents the longitudinal directions, and $Z_1$–$Z_2$ represents the height or vertical directions of the sensor unit 30. The $X_1$–$X_2$, $Y_1$–$Y_2$, and $Z_1$–$Z_2$ directions are perpendicular to one another. CL indicates the centerline of the sensor unit 30 in the $Z_1$–$Z_2$ directions.

The sensor unit 30 includes a printed board 31, a block 32 as a support body, a steel ball 33, a cover 34, a permanent magnet 35, four GaAs Hall elements $36X_1$, $36X_2$, $36Y_1$, and $36Y_2$, a GaAs Hall element 37 for temperature compensation, a lower half case 38, an upper half case 39, and the electrical circuit 50 shown in FIG. 4. The sensor unit 30 has a height $h_1$.

In the sensor unit 30, the GaAs Hall elements $36X_1$, $36X_2$, $38Y_1$, and $38Y_2$ are provided in the center in the height direction with the permanent magnet 35 and the steel ball 33 being provided below and above the GaAs Hall elements $36X_1$, $36X_2$, $36Y_1$, and $36Y_2$, respectively. The steel ball 33 and the permanent magnet 35 are required to be apart from each other by a given distance q so that excessively strong magnetic flux is prevented from affecting the steel ball 33. Thereby, the steel ball 33 is allowed to roll and move when the sensor unit 30 is inclined. The GaAs Hall elements $36X_1$, $36X_2$, $36Y_1$, and $36Y_2$ are incorporated in the sensor unit 30 by using a part positioned in the space defined by the given distance q. That is, the GaAs Hall elements $36X_1$, $38X_2$, $36Y_1$, and $36Y_2$ are incorporated in the sensor unit 30 by using the originally required space. Therefore, no special space is required for the incorporation. Accordingly, the sensor unit 30 is reduced in height or thickness in a part 90 extending from the top of, above the top of, the steel ball 33 so that the height h1 of the sensor unit 30 is reduced compared with that of the conventional sensor unit.

The center of a hemispherical concave part 32a of the block 32, the center of the GaAs Hall elements $36X_1$, $36X_2$, $36Y_1$, and $36Y_2$, the center of the permanent magnet 35, and the center of the GaAs Hall element for temperature compensation are aligned on the center line CL.

Figure 5:
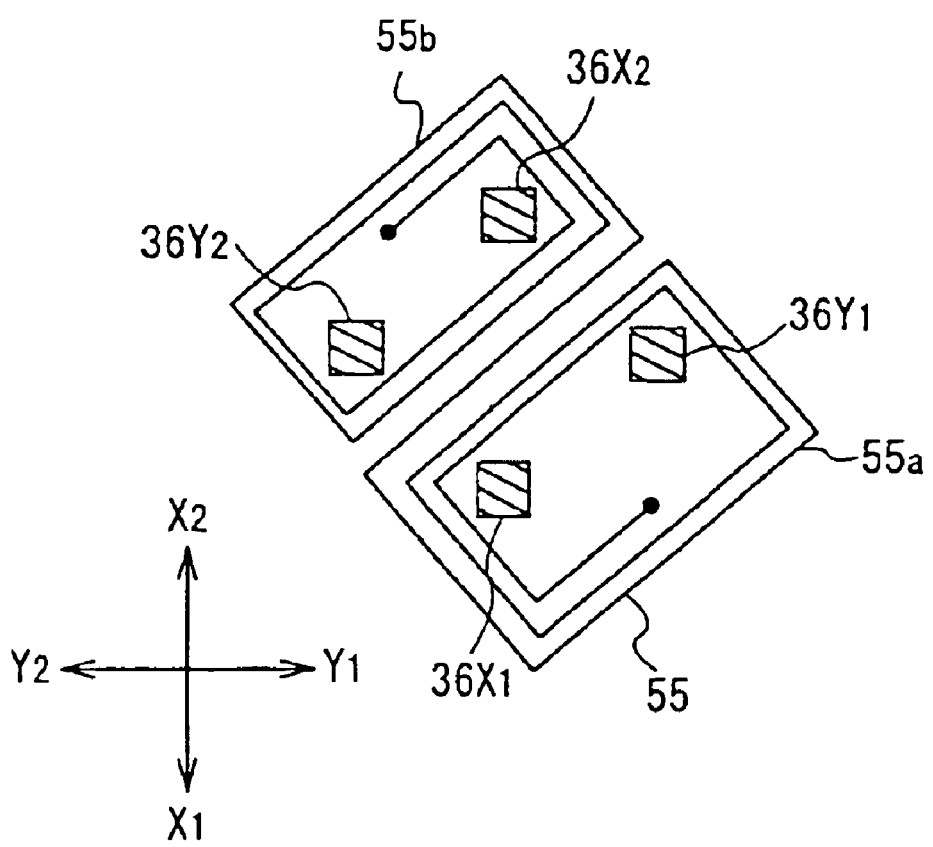
FIG. 5 is a diagram showing a coil pattern for calibration of the sensor unit of FIG. 2.

The GaAs Hall elements $36X_1$, $36X_2$, $36Y_1$, and $36Y_2$ are mounted in the center of the printed board 31. An IC chip 43 into which differential amplifiers 40 through 42 are integrated is mounted in the vicinity of the $Y_1$-directional end ($Y_1$ end) of the printed board 31. A wiring pattern 44 corresponding to the electrical circuit 50 of FIG. 4 is formed on the printed board 31. A coil pattern 44 for calibration shown in FIG. 5 is formed around the GaAs Hall elements $36X_1$, $36X_2$, $36Y_1$, and $36Y_2$. Further, an X-signal pin terminal 45, a Y-signal pin terminal 46, a temperature-signal pin terminal 47, a Vcc pin terminal 48, and a ground pin terminal 49 are provided to the $Y_1$ end of the printed board 31.

The GaAs Hall elements $36X_1$ and $36X_2$ are arranged in the width direction and the GaAs Hall elements $36Y_1$ and $36Y_2$ are arranged in the longitudinal direction on a circle of a radius of 1.5 mm centered on the centerline CL so that each adjacent two of the GaAs Hall elements $36X_1$, $36X_2$, $36Y_1$, and $36Y_2$ are 90° apart.

The block 32 is a substantially rectangular parallelepiped body formed of a nonmagnetic material. The hemispherical concave part 32a of 12 mm in diameter is formed on the upper surface of the block 32. A concave part 32b is formed on the lower surface of the block 32. The block 32 is fixed to the upper surface of the printed board 31 with the concave part 32b covering the GaAs Hall elements $36X_1$, $36X_2$, $36Y_1$, and $36Y_2$.

The steel ball 33 is formed of a magnetic material of 4 mm in diameter and provided inside the hemispherical concave part 32a of the block 32.

The cover 34 is formed of a nonmagnetic material and covers the block 32 so as to close the upper opening of the spherical concave part 32a. A substantially hemispherical convex part 34b is formed in the center of the lower surface of a top plate part 34a of the cover 34.

The hemispherical concave part 32a and the substantially hemispherical convex part 34b form a curved space 51 of a height a slightly larger than 4 mm. The steel ball 33 is contained in the curved space 51 so as to roll freely on a concave surface 32c of the block 32.

The permanent magnet 35 is a thin cylindrical ferrite magnet of 7 mm in diameter and 2.5 mm in thickness, and is magnetized in the height (thickness) direction. The permanent magnet 35 is fixed to the lower surface of the printed board 31 with its north pole facing upward ($Z_1$ direction) and its south pole facing downward.

The GaAs Hall element 37 for temperature compensation is fixed to the tip of a belt-like flexible substrate 52. The flexible substrate 52 is bonded to the lower surface of the permanent magnet 35 with one of its ends being connected to the lower surface of the printed board 31.

The lower half case 38 is formed of an iron plate and fixed to the lower surface of the printed board 31 so as to cover the permanent magnet 35, the flexible substrate 52, and the GaAs Hall element 37 for temperature compensation.

The upper half case 39 is formed of an iron plate and covers the cover 34 so as to join the lower half case 38. The upper half case 39 may be omitted in some cases.

The half cases 38 and 39 function as a magnetic flux path so as to prevent magnetic flux from leaking outside the sensor unit 30.

As shown in FIG. 2, the sensor unit 30 of the above-described configuration is mounted on the printed board 70 with the lower ends of the pin terminals 45 through 49 being fitted and soldered to through holes formed in the printed board 70 at positions corresponding to pads and the lower half case 38 being placed on the printed board 70. Further, the sensor unit 30 is electrically connected to the signal processing circuit 60 formed on the printed board 70.

Figure 8:
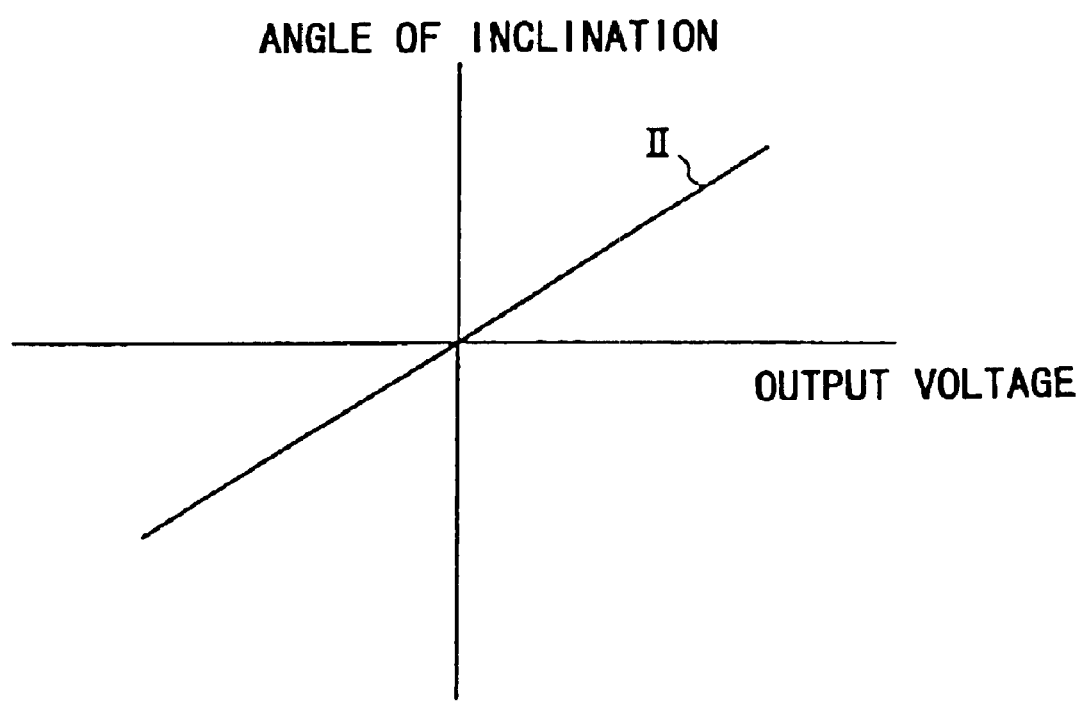
FIG. 8 is a diagram showing a relationship between a voltage value and an angle of inclination.

As shown in FIG. 4, the signal processing circuit 60 includes an analog-to-digital (A/D) converter 61 and a central processing unit (CPU) 62. The CPU 62 includes a calculation part 63, a storage part 64, a clock part 65, and an interface part 66. The calculation part 63 calculates an angle of inclination from a voltage value. A line II shown in FIG. 8 represents a relationship between the voltage value and the calculated angle of inclination.

Next, a description will be given of an operation of the sensor unit 30.

A voltage Vcc causes electric current to flow through the GaAs Hall elements $36X_1$, $36X_2$, $36Y_1$, and $36Y_2$.

Gravity G and a magnetic attraction M caused by the permanent magnet 35 are exerted on the steel ball 33.

When the sensor unit 30 is in a horizontal (level) state as shown in FIG. 2, the gravity G and the magnetic attraction M are exerted in the same direction so that the steel ball 33 is positioned on the center line CL as shown in FIG. 2. The steel ball 33 is affected by the magnetic force of the permanent magnet 35 so as to have a south pole on its lower end side and a north pole on its upper end side. A magnetic field 81 indicated by lines of magnetic force 80 is formed between the north pole of the permanent magnet 35 and the lower end of the steel ball 33. A magnetic field 83 indicated by lines of magnetic force 82 is formed between the upper end of the steel ball 33 and the upper half case 39. A magnetic field 85 indicated by lines of magnetic force 84 is formed between the south pole of the permanent magnet 35 and the lower half case 38. The GaAs Hall elements $36X_1$, $36X_2$, $36Y_1$, and $36Y_2$ are provided in the magnetic field 81.

A description will be given of the magnetic field 81 affecting the GaAs Hall elements $36X_1$, $36X_2$, $36Y_1$, and $36Y_2$.

Figure 7:
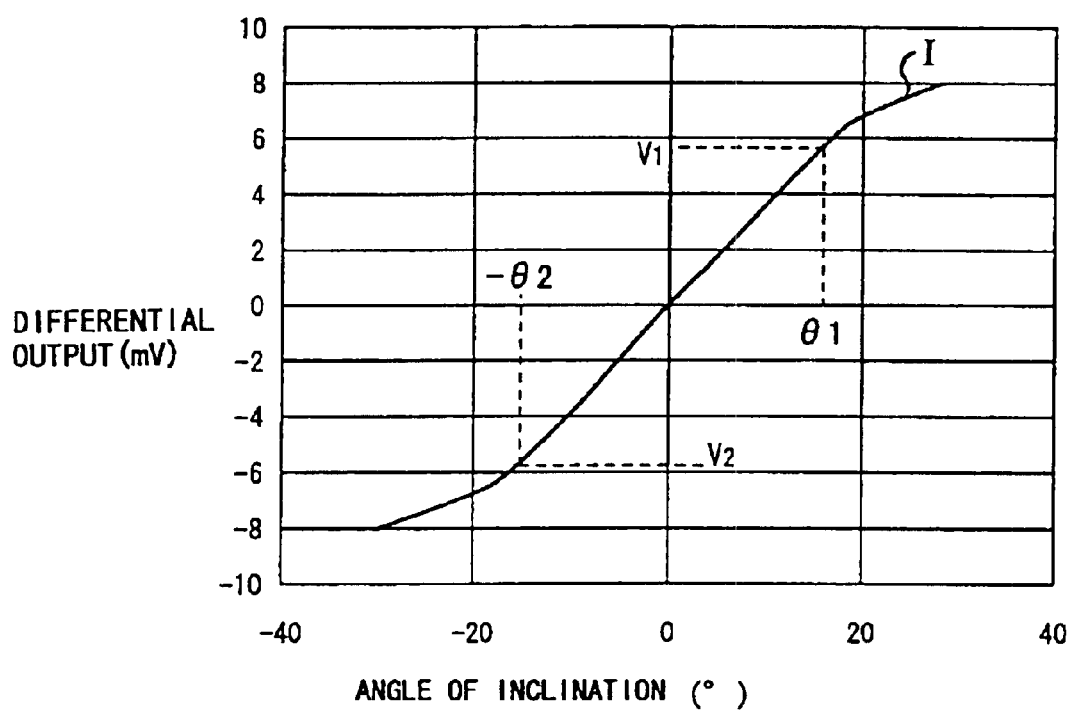
FIG. 7 is a diagram showing a relationship between an angle of inclination and an output voltage.

Since the steel ball 33 is positioned on the centerline CL, the magnetic field 81 is symmetrical with respect to the centerline CL. Therefore, the magnetic field 81 affects the GaAs Hall elements $36X_1$, $36X_2$, $36Y_1$, and $36Y_2$ equally in strength, so that the GaAs Hall elements $36X_1$, $36X_2$, $36Y_1$, and $36Y_2$ output equal voltages. Accordingly, as shown in FIG. 7, the output voltage of the Y-signal pin terminal 46 is zero. The output voltage of the X-signal pin terminal 45 is also zero.

Figure 6A:
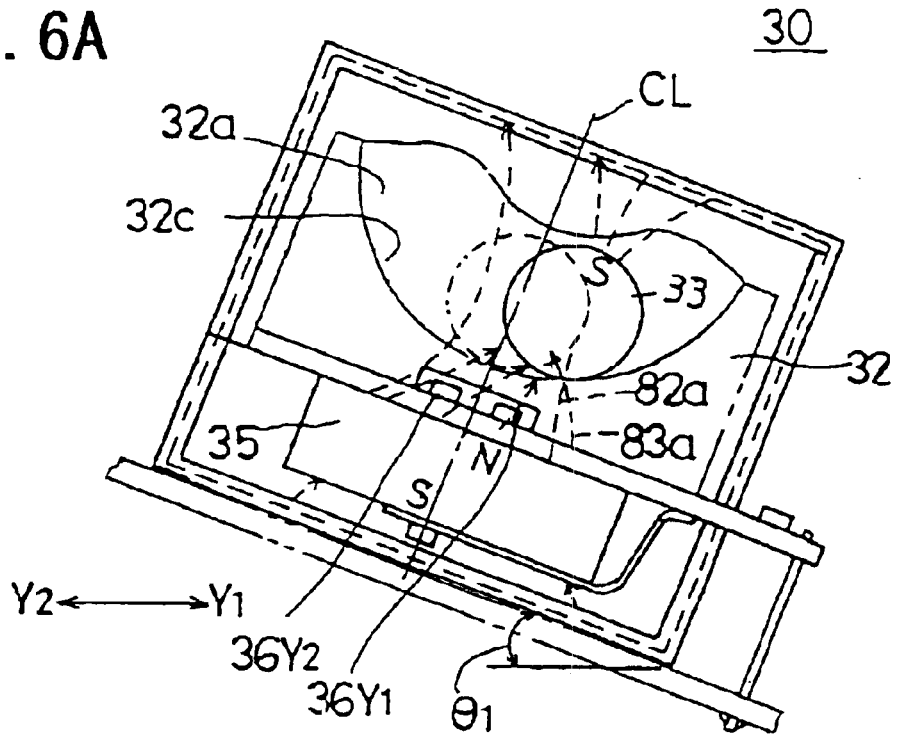
FIGS. 6A and 6B are diagrams showing inclined states of the sensor unit of FIG. 2.

When the sensor unit 30 is inclined at an angle of $+\theta_1$ to the $Y_1$ side as shown in FIG. 6A, the steel ball 33 rolls on the concave surface 32c toward the $Y_1$ direction to reach a position where the gravity G and the magnetic attraction M are balanced. Therefore, the steel ball 33 is deviated from the vertical centerline CL toward the $Y_1$ direction.

Consequently, the lines of magnetic force 82 change to a state indicated by reference numeral 82a so that the magnetic field 83 changes to a state indicated by reference numeral 83a. This increases magnetic field strength exerted on the GaAs Hall element $36Y_1$ and decreases magnetic field strength exerted on the GaAs Hall element $36Y_2$. Therefore, the output voltage of the GaAs Hall element $36Y_1$ increases and the output voltage of the GaAs Hall element $36Y_2$ decreases. The differential amplifier 41 outputs a signal that is a function of a difference between the two output voltages so that a positive voltage $V_1$ is output from the Y-signal pin terminal 46 as shown in FIG. 7. The output voltage of the X-signal pin terminal 45 remains zero.

Figure 6B:
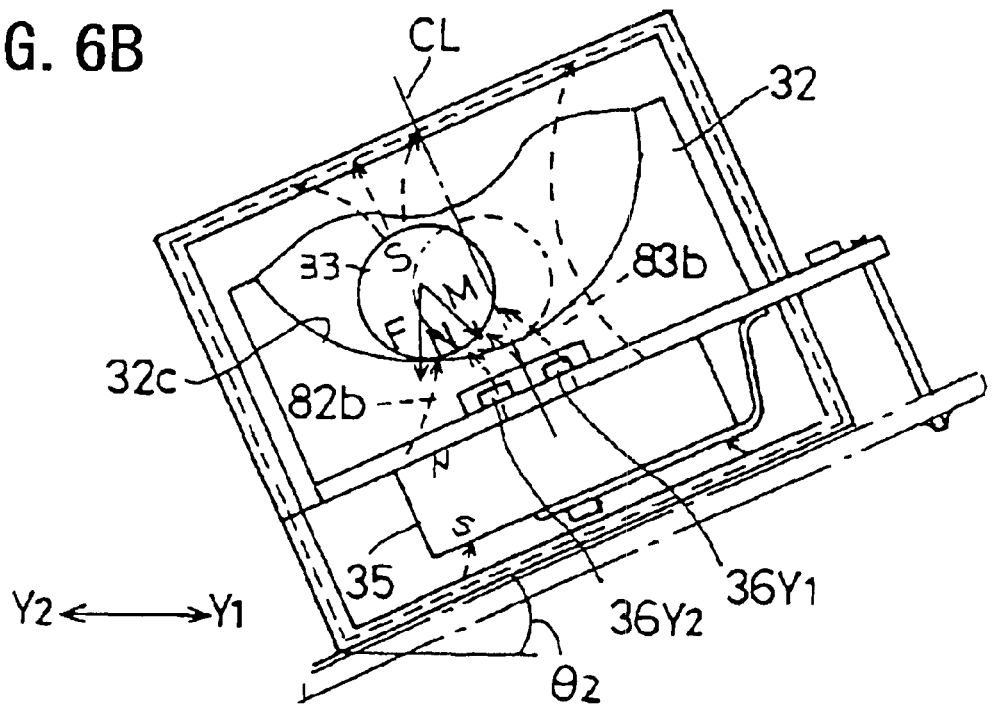

On the other hand, when the sensor unit 30 is inclined at an angle of $-\theta_2$ to the $Y_2$ side as shown in FIG. 6B, the steel ball 33 rolls on the concave surface 32c toward the $Y_2$ direction to reach a position where the gravity G and the magnetic attraction M are balanced. Therefore, the steel ball 33 is deviated from the vertical centerline CL toward the $Y_2$ direction.

Consequently, the lines of magnetic force 82 changes to a state indicated by reference numeral 82b so that the magnetic field 83 changes to a state indicated by reference numeral 83b. This increases magnetic field strength exerted on the GaAs Hall element $36Y_2$ and decreases magnetic field strength exerted on the GaAs Hall element $36Y_1$. Therefore, the output voltage of the GaAs Hall element $36Y_2$ increases and the output voltage of the GaAs Hall element $36Y_1$ decreases. The differential amplifier 41 outputs a signal that is a function of a difference between the two output voltages so that a negative voltage $V_2$ is output from the Y-signal pin terminal 46 as shown in FIG. 7. The output voltage of the X-signal pin terminal 45 remains zero.

Therefore, a voltage corresponding to an angle of inclination of the sensor unit 30 in the longitudinal or $Y_1$-$Y_2$ directions is output from the Y-signal pin terminal 46 as indicated by a line I in FIG. 7.

When the sensor unit 30 is inclined in the width or $X_1$-$X_2$ directions, a voltage corresponding to an angle of inclination in the width or $X_1$-$X_2$ directions is output from the X-signal pin terminal 45.

When the sensor unit 30 is inclined in a direction between the $Y_1$-$Y_2$ and $X_1$-$X_2$ directions, a voltage corresponding to a $Y_1$-$Y_2$-directional component of the inclination is output from the Y-signal pin terminal 46 and a voltage corresponding to a $X_1$-$X_2$-directional component of the inclination is output from the X-signal pin terminal 45.

With the sensor unit 30 being mounted on the printed board 70, when an electronic apparatus including the printed board 70 is inclined, the sensor unit 30 is inclined together with the electronic apparatus so as to output voltages from the X-signal pin terminal 45 and the Y-signal pin terminal 46. The output voltages are transmitted to the signal processing circuit 60. As shown in FIG. 4, first, the voltages are converted into digital signals by the A/D converter 61. The digital signals are transmitted to the calculation part 63 inside the CPU 62 so that the calculation part 63 calculates an angle of inclination. Then, an inclination angle signal is output from an output terminal 67. An alarm signal is output from a terminal 68 if the angle of inclination exceeds a given value.

Next, a description will be given of characteristics of the sensor unit 30.

(A) Reduced in Height ($h_1$) and Size

In the sensor unit 30, the GaAs Hall elements $36X_1$, $36X_2$, $36Y_1$, and $36Y_2$ are provided in the center in the height direction with the permanent magnet 35 and the steel ball 33 being provided below and above, respectively, the GaAs Hall elements $36X_1$, $36X_2$, $36Y_1$, and $36Y_2$, respectively.

Figure 1:
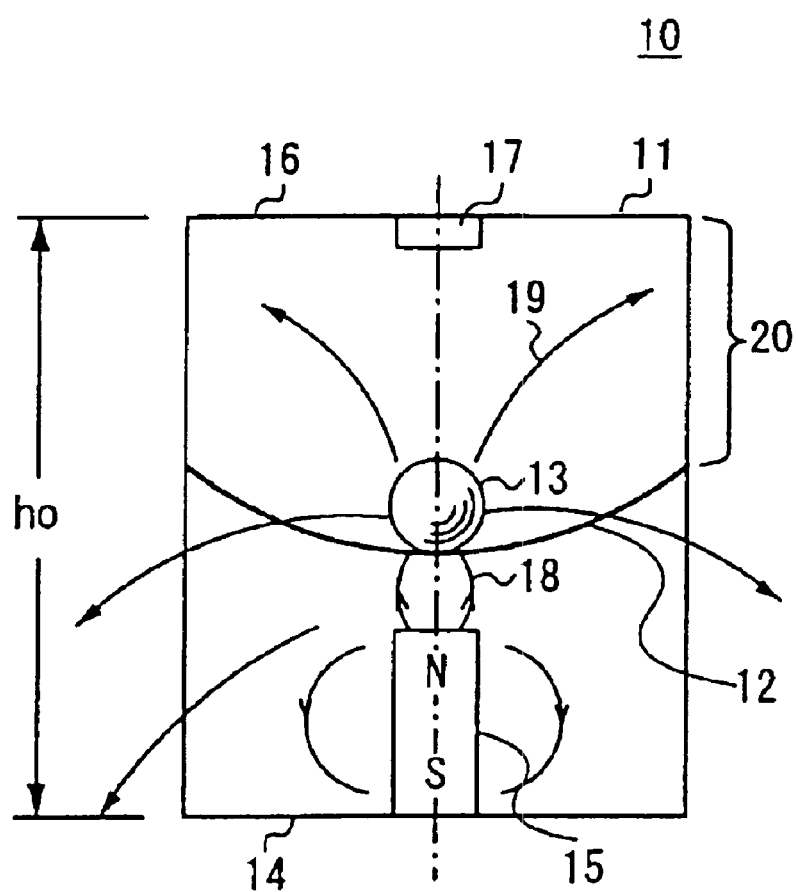
FIG. 1 is a diagram showing a conventional sensor unit.

As shown in FIG. 1, a relatively large space is required above the magnetic spherical body 13 when the Hall element 17 is provided above the magnetic spherical body 13. Therefore, it is difficult to reduce the conventional sensor unit 10 in height.

On the other hand, in the sensor unit 30, the GaAs Hall elements $36X_1$, $36X_2$, $36Y_1$, and $36Y_2$ are incorporated by using the originally required space between the permanent magnet 35 and the steel ball 33. Therefore, no special space is required above the steel ball 33. Accordingly, the sensor unit 30 has the part 90 above the top of the steel ball 33 reduced in height. Thereby, the sensor unit 30 is downsized with the reduced height $h_1$ compared with the conventional sensor unit.

(B) Easy to Assemble

As shown in FIGS. 2 and 3, in the sensor unit 30, the printed board 31 on which the GaAs Hall elements $36X_1$, $36X_2$, $36Y_1$, and $36Y_2$ are mounted is provided in the center in the height direction with the block 32 and the permanent magnet 35 being fixed to the upper and lower surfaces of the printed board 31, respectively. Therefore, connections between the GaAs Hall elements $36X_1$, $36X_2$, $36Y_1$, and $36Y_2$ and external terminals are made through the wiring pattern 44 formed on the printed board 31. This saves troublesome work of providing lead lines. Thus, the sensor unit 30 is easy to assemble.

(C) Easy to Mount on a Printed Board

As shown in FIGS. 2 and 3, the pin terminals 45 through 49 are provided alongside the lower half case 38. Each of the pin terminals 45 through 49 has a vertical dimension c complying with a vertical dimension (height) b of the lower half case 38.

Therefore, the sensor unit 30 is mounted easily on the printed board 70 by soldering the lower ends of the pin terminals 45 through 49 to the corresponding pads formed on the printed board 70.

The lower half case 38 supports the weight of the sensor unit 30. Favorably, this allows no force for supporting the weight of the sensor unit 30 to be exerted on the pin terminals 45 through 49.

(D) Highly Impact-resistant

If the steel ball 33 jumps (moves vertically) upward, a wrong voltage is output. The substantially hemispherical convex part 34b formed on the lower surface of the top plate part 34a of the cover 34 restricts an upward jump of the steel ball 33, thereby avoiding a wrong voltage output.

(E) No External Leakage of Magnetic Flux

In the sensor unit 30, the lower and upper half cases 38 and 39 formed of iron plates serve as a magnetic flux path so as to prevent magnetic flux from leaking outside the sensor unit 30. Therefore, components provided around the sensor unit 30 are not affected by the magnetic fields of the sensor unit 30.

(F) High Detection Accuracy

The sensor unit 30 has high detection accuracy for the following four reasons.

1. Calibration

The sensor unit 30 performs calibration. As shown in FIG. 5, the coil pattern 55 for calibration is composed of a coil pattern part 55a wound around the GaAs Hall elements $36X_1$ and $36Y_1$ and a coil pattern part 55b wound around the GaAs Hall elements $36X_2$ and $36Y_2$. The coil pattern parts 55a and 55b are wound in opposite directions. Therefore, when an electric current for calibration flows through the coil pattern 55 via calibration terminals (not shown in the drawing), magnetic fields of the same strength are applied to the GaAs Hall elements $36X_1$ and $36Y_1$ and to the GaAs Hall elements $36X_2$ and $36Y_2$, respectively, in opposite directions.

At this point, the output voltages of the X-signal pin terminal 45 and the Y-signal pin terminal 46 are measured and stored as calibration values. The output voltage of the X-signal pin terminal 45 represents a difference in sensitivity between the GaAs Hall elements $36X_1$ and $36X_2$ and the output voltage of the Y-signal pin terminal 46 represents a difference in sensitivity between the GaAs Hall elements $36Y_1$ and $36Y_2$.

The output voltages obtained in the above-described calibration operation are added to or subtracted from output voltage values of the X-signal pin terminal 45 and the Y-signal pin terminal 46 obtained by actual measurement. Thereby, output voltage values based on the output voltages obtained in the calibration operation are obtained as output voltage values adjusted by calibration. An angle of inclination can be obtained with accuracy based on the calibration-adjusted output voltage values. The calibration operation is performed when power is turned on.

2. Temperature Compensation

The sensor unit 30 performs temperature compensation. The ferrite permanent magnet 35 has a temperature characteristic shown by a line III in FIG. 9A. The temperature coefficient of a residual magnetic flux density Br is negative. Each of the GaAs Hall elements $36X_1$, $36X_2$, $36Y_1$, and $36Y_2$ has a temperature characteristic shown by a line IV in FIG. 9B and a negative temperature coefficient.

Therefore, when the sensor unit 30 is mounted in an electronic apparatus that incurs an increase in temperature while in use, such as a projector, the temperature of the sensor unit 30 increases as that of the electronic apparatus rises. As a result, the output voltages of the X-signal pin terminal 45 and the Y-signal pin terminal 46 of the sensor unit 30 decrease although the inclination angle of the electronic apparatus remains the same. Therefore, it is difficult to measure an angle of inclination with accuracy.

Accordingly, the GaAs Hall element 37 for temperature compensation is fixed to the lower surface of the permanent magnet 35. The Hall element 37 for temperature compensation and the Hall elements $36X_1$, $36X_2$, $36Y_1$, and $36Y_2$ are of the same GaAs type.

Figure 9C:
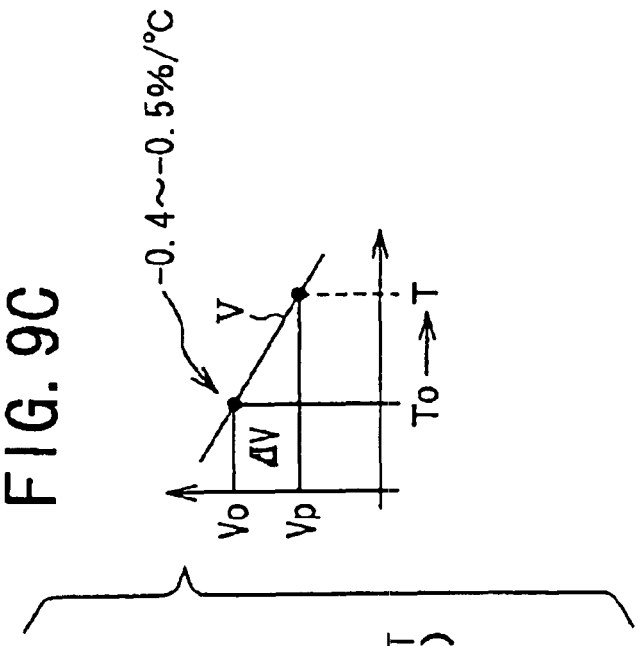
FIGS. 9A through 9C are diagrams for illustrating temperature compensation.
Figure 9A:
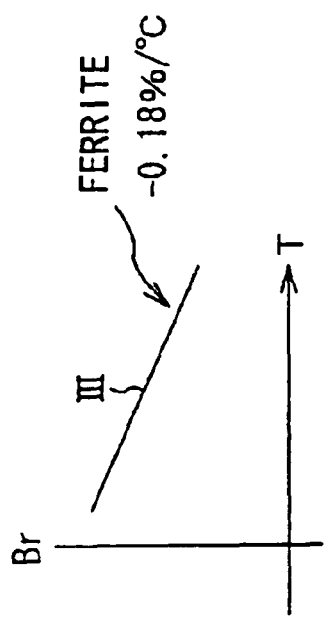
Figure 9B:
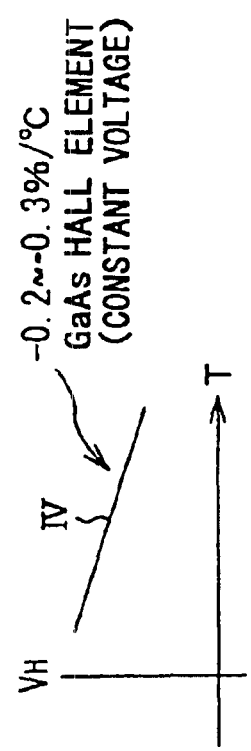

The output voltage of the GaAs Hall element 37 decreases as ambient temperature increases as shown by a line V in FIG. 9C. This decrease results from the temperature characteristics of both the ferrite permanent magnet 35 and the GaAs Hall element 37 for temperature compensation.

An output voltage Vo of the temperature-signal pin terminal 47 is measured and stored in an initial state before starting the operation of a projector, for instance. The output voltage of the temperature-signal pin terminal 47 continues to be measured. An output voltage of the temperature-signal pin terminal 47 at the time of measurement of an angle of inclination by the sensor unit 30 is indicated by Vp in FIG. 9C.

The CPU 62 of FIG. 4 performs the following operation where each of output voltages Vx and Vy of the X-signal pin terminal 45 and the Y-signal pin terminal 46, respectively, of the sensor unit 30 is multiplied by a coefficient Vp/Vo:

Vx×Vp/Vo

Vy×Vp/Vo

Thereby, an inclination angle signal adjusted by temperature compensation is output from the output terminal 67 of FIG. 4. In the inclination angle signal, an output variation due to a variation in temperature is cancelled out.

The GaAs Hall element 37 for temperature compensation is fixed to the lower surface of the permanent magnet 35. Therefore, on the GaAs Hall element 37, temperature compensation considering the temperature characteristic of the ferrite permanent magnet 35 in addition to the temperature characteristic of each of the GaAs Hall elements $36X_1$, $36X_2$, $36Y_1$, and $36Y_2$, that is, a more accurate temperature compensation, is performed.

Further, the GaAs Hall element 37, which is provided on the lower surface side of the permanent magnet 35, is positioned across the permanent magnet 35 from the steel ball 33. Therefore, even if the steel ball 33 moves, no change is effected in the magnetic field affecting the GaAs Hall element 37. Thereby, temperature compensation is performed with accuracy.

3. The GaAs Hall elements $36X_1$, $36X_2$, $36Y_1$, and $36Y_2$ are provided between the permanent magnet 35 and the steel ball 33 to be affected by a strong magnetic field. Further, a great variation is caused in the strength of the magnetic field when the steel ball 33 moves.

4. The iron-made lower and upper half cases 38 and 39 are provided to prevent magnetic flux from leaking outside the sensor unit 30. The magnetic field affecting the GaAs Hall elements $36X_1$, $36X_2$, $36Y_1$, and $36Y_2$ is all the stronger therefor.

The sensor unit 30 of FIG. 2 is applicable to acceleration measurement as will be later described.

Second Embodiment

Figure 10A:
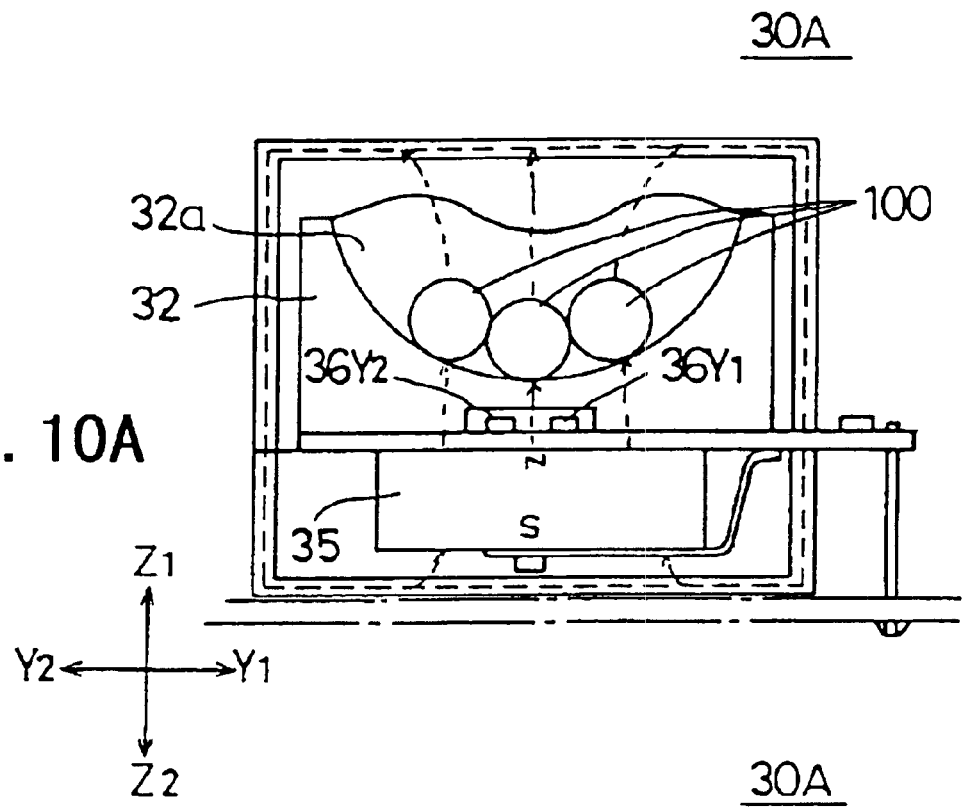
FIGS. 10A and 10B are diagrams showing a sensor unit according to a second embodiment of the present invention.
Figure 10B:
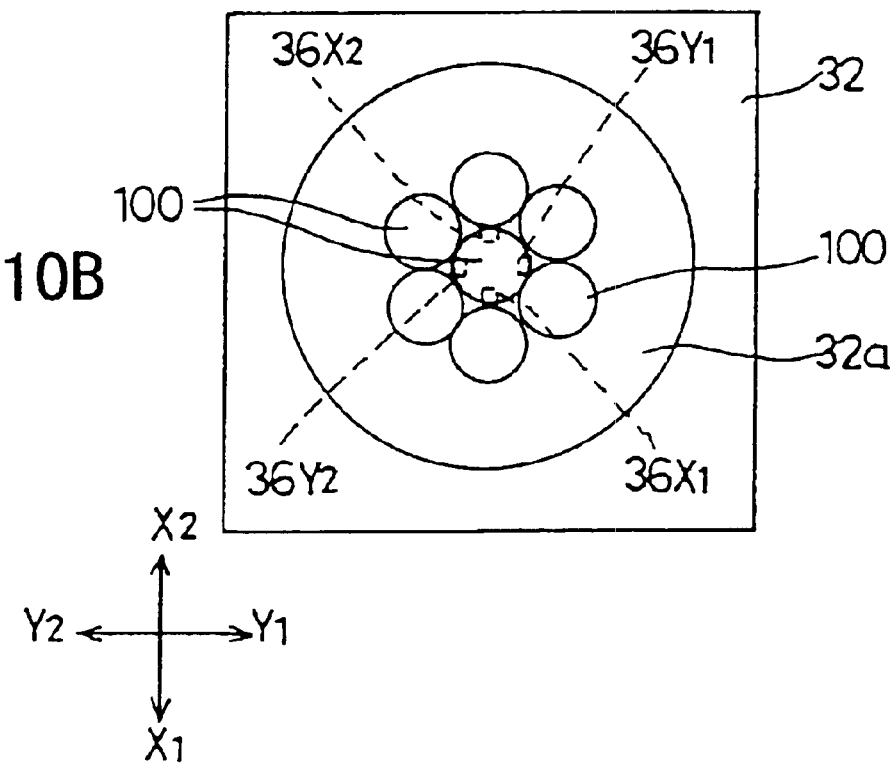

FIGS. 10A and 10B are diagrams showing a sensor unit 30A according to a second embodiment of the present invention.

The sensor unit 30A is different from the sensor unit 30 of FIG. 2 in that seven steel balls 100 each of 3 mm in diameter are provided like flower petals in the hemispherical concave part 32a of the block 32.

When the sensor unit 30A is inclined, the seven steel balls 33 move. Compared with the configuration of the sensor unit 30 of FIG. 2, where the single steel ball 33 moves, a greater variation is effected in the magnetic field affecting the GaAs Hall elements $36X_1$, $36X_2$, $36Y_1$, and $36Y_2$. Therefore, the sensor unit 30A is higher in sensitivity than the sensor unit 30 of FIG. 2.

Third Embodiment

Figure 11A:
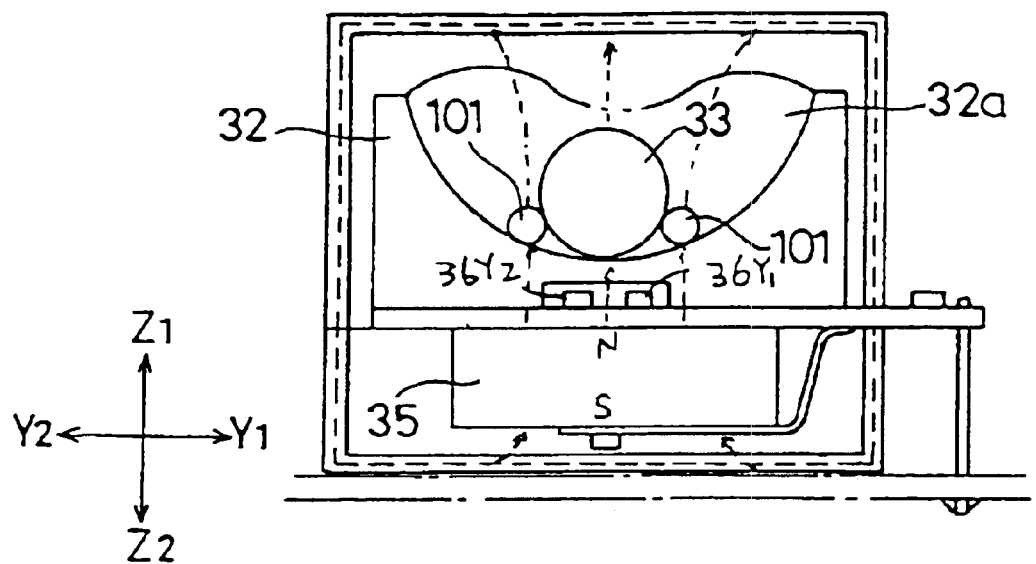
FIGS. 11A and 11B are diagrams showing a sensor unit according to a third embodiment of the present invention.
Figure 11B:
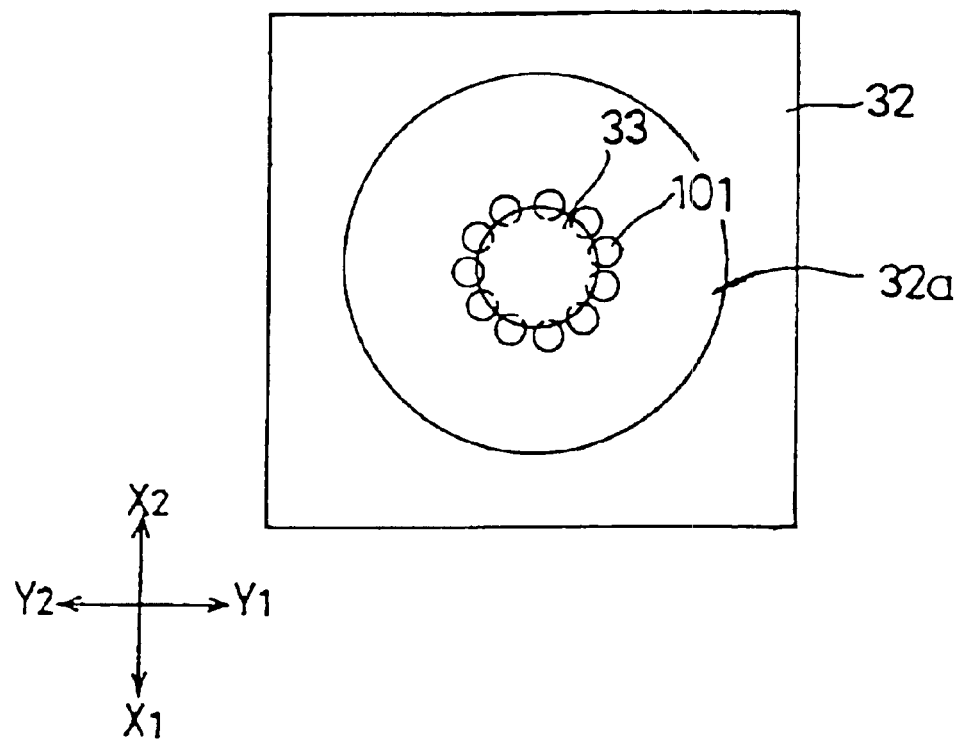

FIGS. 11A and 11B are diagrams showing a sensor unit 30B according to a third embodiment of the present invention.

The sensor unit 30B is a variation of the sensor unit 30A. In the sensor unit 30B, a plurality of steel balls 101 each of 1 mm in diameter are provided around the steel ball 33. The sensor unit 30B is higher in sensitivity than the sensor unit 30 of FIG. 2 for the same reason as stated in the second embodiment.

Fourth Embodiment

Figure 12A:
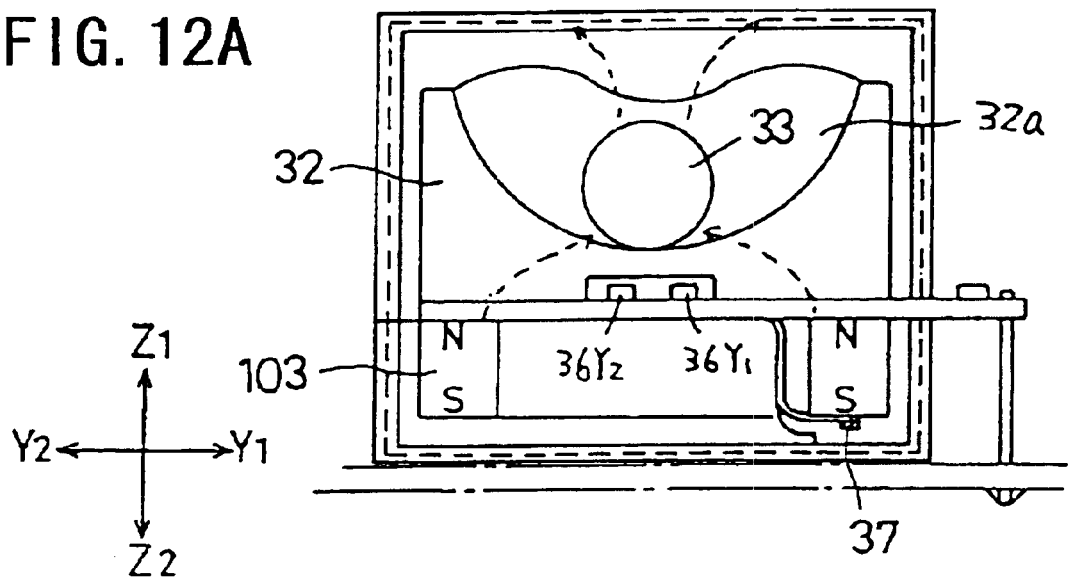
FIGS. 12A and 12B are diagrams showing a sensor unit according to a fourth embodiment of the present invention.
Figure 12B:
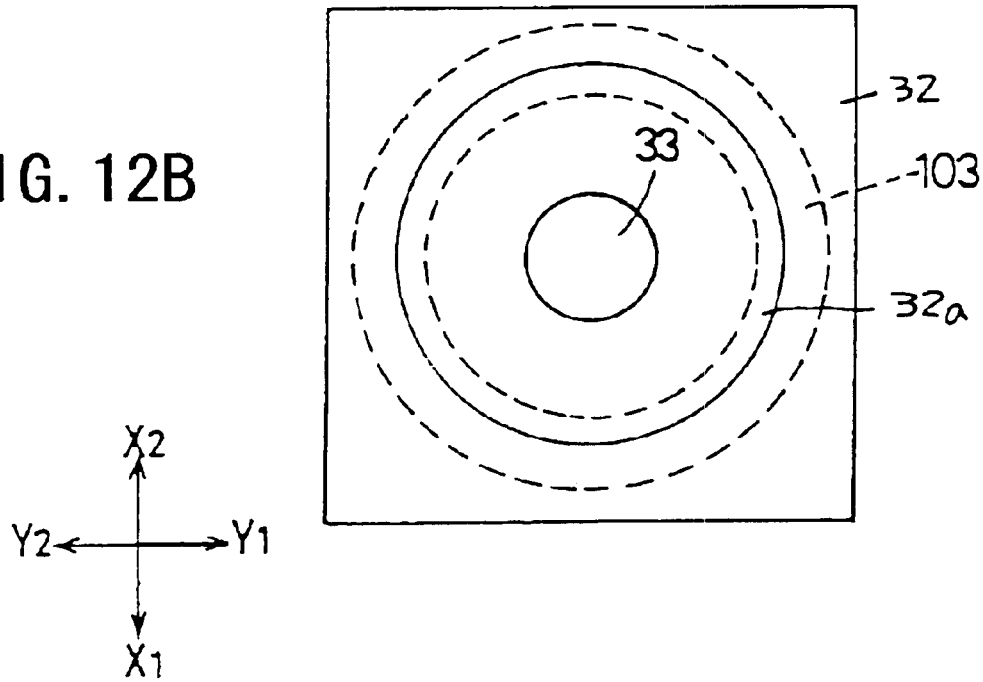

FIGS. 12A and 12B are diagrams showing a sensor unit 30C according to a fourth embodiment of the present invention.

The sensor unit 30C is different from the sensor unit 30 of FIG. 2 in that an annular permanent magnet 103 replaces the cylindrical permanent magnet 35. The permanent magnet 103 is magnetized in the $Z_1$–$Z_2$ directions.

Fifth Embodiment

Figure 13A:
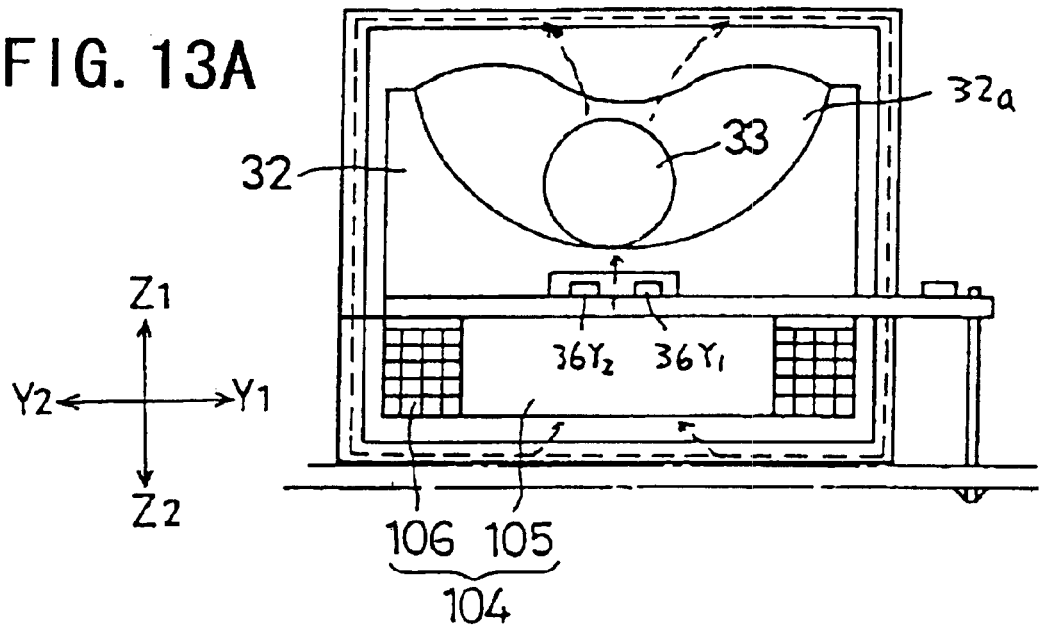
FIGS. 13A and 13B are diagrams showing a sensor unit according to a fifth embodiment of the present invention.
Figure 13B:
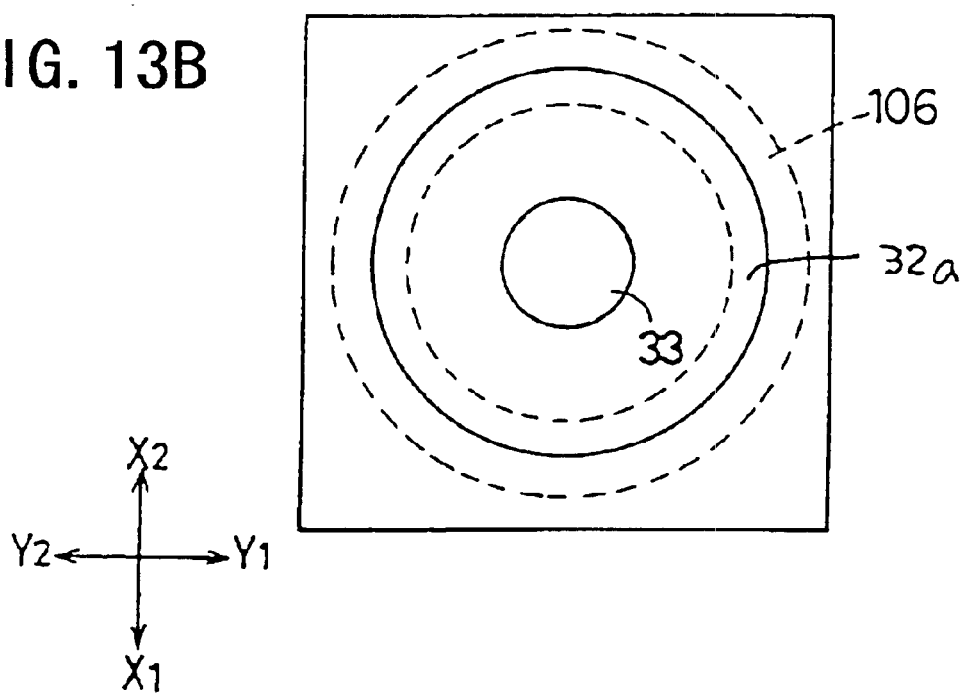

FIGS. 13A and 13B are diagrams showing a sensor unit 30D according to a fifth embodiment of the present invention.

The sensor unit 30D is a variation of the sensor unit 30C, is different therefrom in that an electromagnet 104 replaces the annular permanent magnet 103. The electromagnet 104 is formed of a central iron core 105 with a coil 106 wound therearound.

An electric current flows through the coil 106 when the sensor unit 30D is operated.

Sixth Embodiment

Figure 14:
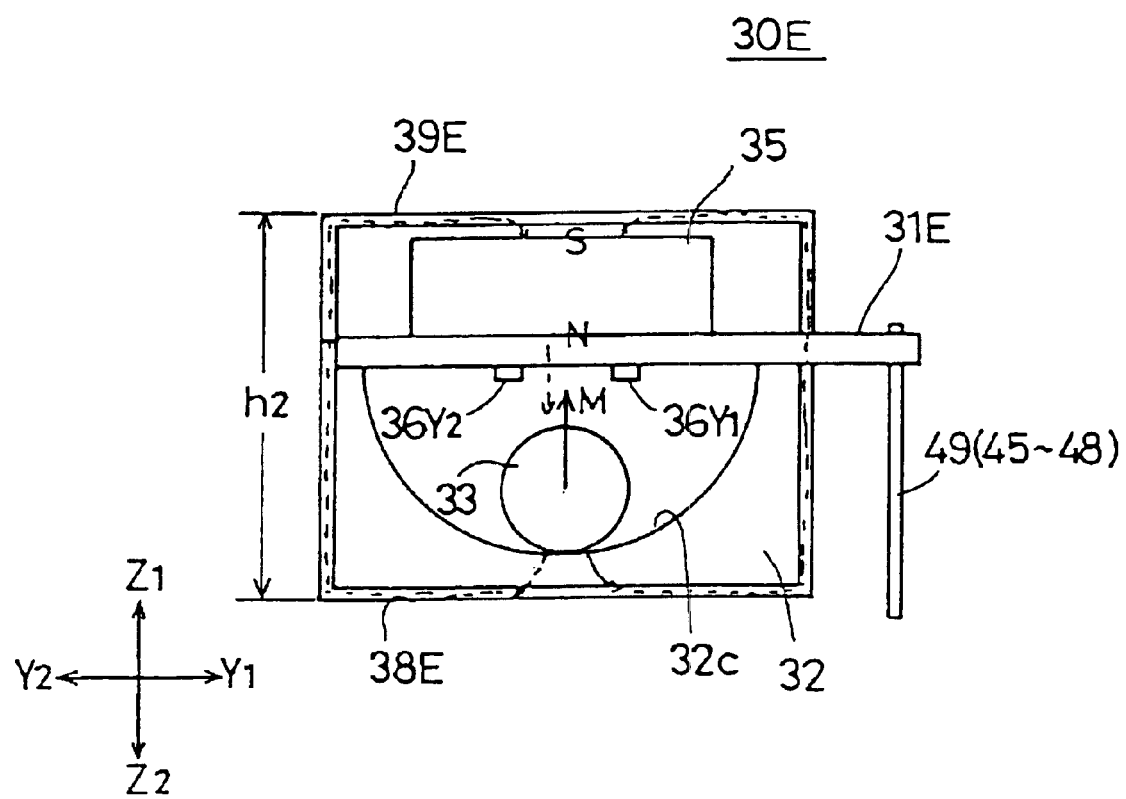
FIG. 14 is a sectional view of a sensor unit according to a sixth embodiment of the present invention.

FIG. 14 is a diagram showing a sensor unit 30E according to a sixth embodiment of the present invention.

The sensor unit 30E is upside down in configuration compared with the sensor unit 30 shown in FIGS. 2 and 3. In the sensor unit 30E, the GaAs Hall elements $36X_1$, $36X_2$, $36Y_1$, and $36Y_2$ are provided in the center in the height or $Z_1$–$Z_2$ directions with the permanent magnet 35 and the steel ball 33 being provided above and below the GaAs Hall elements $36X_1$, $36X_2$, $36Y_1$, and $36Y_2$, respectively.

The GaAs Hall elements $36X_1$, $36X_2$, $36Y_1$, and $36Y_2$ are mounted on the lower surface of a printed board 31E and the permanent magnet 35 is fixed to the upper surface of the printed board 31E. The block 32 is fixed to the lower surface of the printed board 31E. The upper opening of the hemispherical concave part 32a is closed by the printed board 31E. The steel ball 33 is contained inside the hemispherical concave part 32a. The block 32 is covered by a lower half case 38E and the permanent magnet 35 is covered by an upper half case 39E.

Like the sensor unit 30 shown in FIGS. 2 and 3, the sensor unit 30E is downsized with a reduced height $h_2$. Further, the sensor unit 30E requires no wiring of lead lines, thus being easy to produce in terms of structure.

When the sensor unit 30E is inclined, the steel ball 33 rolls on the concave surface 32c to move from a position shown in FIG. 14, thereby effecting a change in the strength of the magnetic field affecting the GaAs Hall elements $36X_1$, $36X_2$, $36Y_1$, and $36Y_2$. Thereby, voltages corresponding to the angle and direction of inclination of the sensor unit 30E are output from the pin terminals 45 and 46.

Since the permanent magnet 35 is positioned above the steel ball 33, an upward magnetic attraction M is exerted on the steel ball 33. Therefore, the degree of movement of the steel ball 33 to inclination is greater in the sensor unit 30E than in the sensor unit 30. Therefore, the sensor unit 30E is higher in sensitivity than the sensor unit 30.

Seventh Embodiment

Figure 15A:
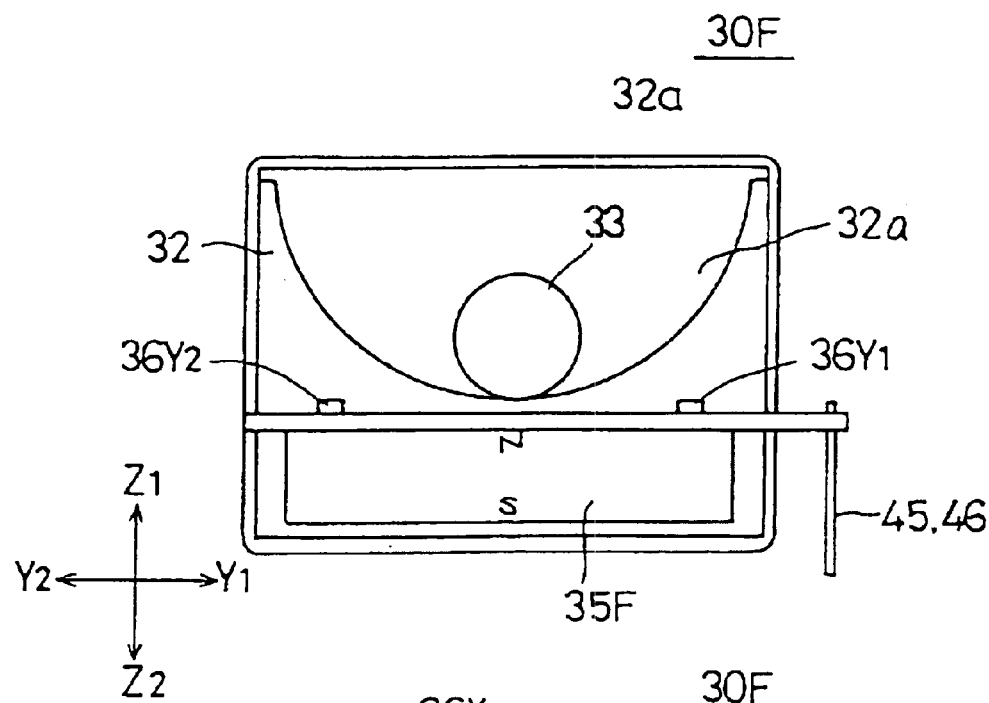
FIGS. 15A and 15B are diagrams showing a sensor unit according to a seventh embodiment of the present invention.
Figure 15B:
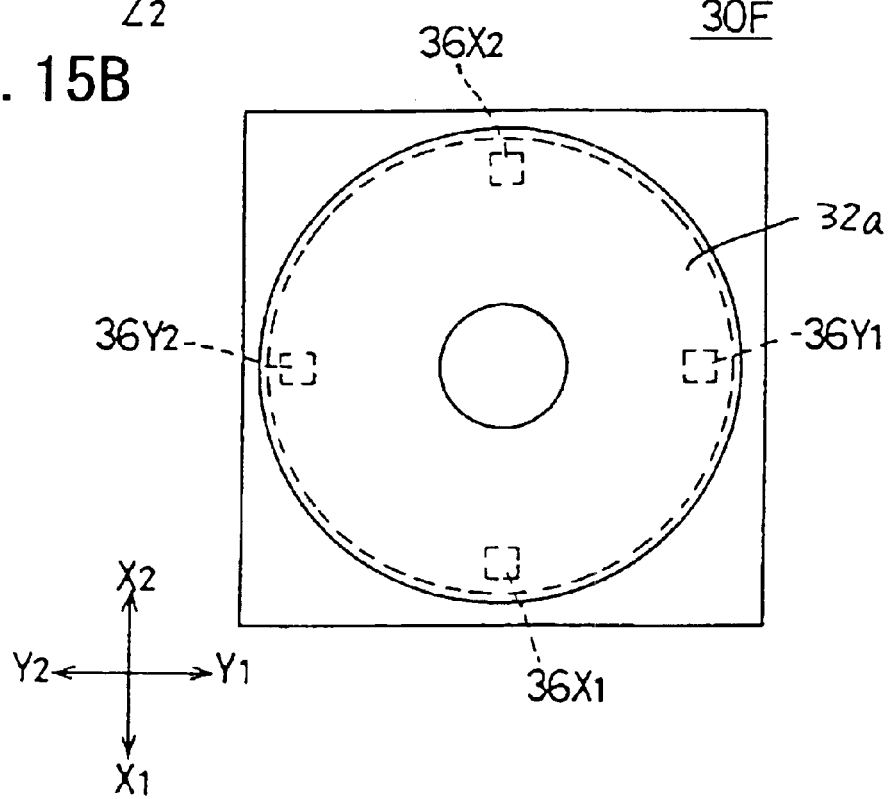

FIGS. 15A and 15B are diagrams showing a sensor unit 30F according to a seventh embodiment of the present invention.

The sensor unit 30F has a structure suitable for acceleration and impact detection. A calculation program for obtaining the magnitude and direction of acceleration is installed in the CPU 62 of FIG. 4.

A permanent magnet 35F is greater in strength than the permanent magnet 35 of the sensor unit 30 of FIG. 2. The GaAs Hall elements $36X_1$ and $36X_2$ and the GaAs Hall elements $36Y_1$, and $36Y_2$ are provided with more distance therebetween in the $X_1X_2$ and $Y_1-Y_2$ directions, respectively, in the sensor unit 30F than in the sensor unit 30.

The steel ball 33 is magnetically attracted strongly by the permanent magnet 35F. Therefore, the steel ball 33 hardly moves even when the sensor unit 30F is inclined or turned upside down. Further, the GaAs Hall elements $36X_1$, $36X_2$, $36Y_1$, and $36Y_2$ are distant from the steel ball 33. Therefore, even when the sensor unit 30F is inclined, no change is effected in the magnetic field affecting the GaAs Hall elements $36X_1$, $36X_2$, $36Y_1$, and $36Y_2$. Accordingly, the output voltages of the sensor unit F remain zero.

When an acceleration greater than the acceleration of gravity is exerted on the sensor unit 30F, the steel ball 33, by its inertial force, rolls on the concave surface 32c of the hemispherical concave part 32a against magnetic attraction caused by the permanent magnet 35F so as to deviate from a position shown in FIG. 15A. This causes a variation in the strength of the magnetic field affecting the GaAs Hall elements $36X_1$, $36X_2$, $36Y_1$, and $36Y_2$, so that voltages corresponding to the magnitude and direction of the acceleration exerted on the sensor unit 30F are output from the pin terminals 45 and 46.

Figure 16:
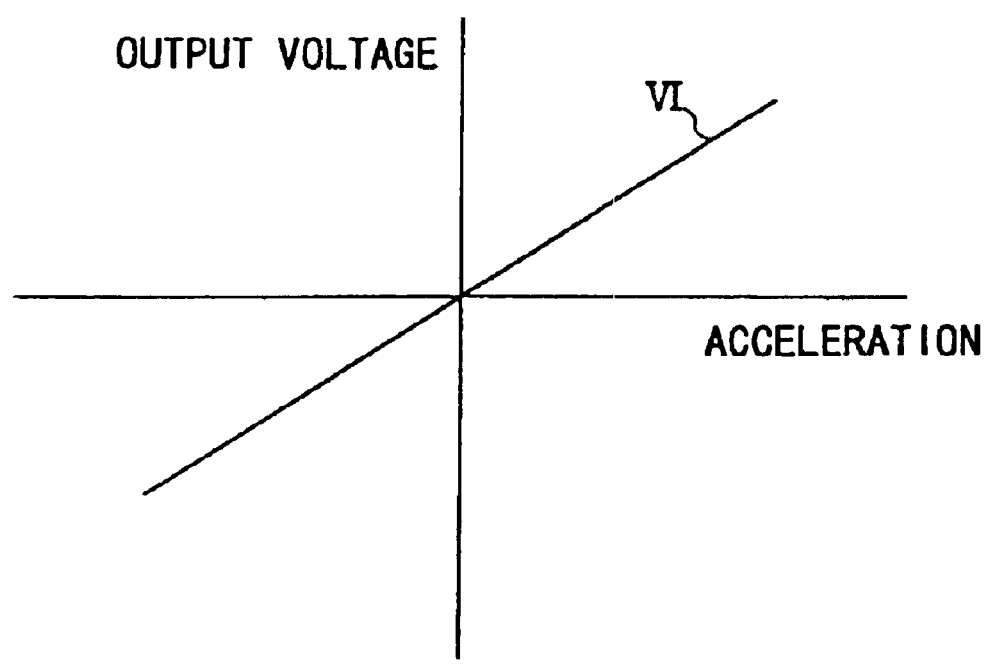
FIG. 16 is a diagram showing a relationship between acceleration and an output voltage.

The magnitude of acceleration is proportional to the output voltage as shown by a line VI in FIG. 16. Further, the calculation part 63 of the CPU 62 of FIG. 4 calculates a variation in each output voltage per unit time and performs calculation for obtaining the magnitude and direction of acceleration. Thereby, the magnitude and direction of acceleration are calculated, so that an acceleration signal is output from the output terminal 67. An alarm signal is output from the terminal 68 if the acceleration exceeds a given value.

When the acceleration is no longer exerted on the sensor unit 30F, the steel ball 33 is brought back to the position shown in FIG. 15A by the magnetic attraction of the permanent magnet 35F. Since the magnetic attraction of the permanent magnet 35F is employed to return the steel ball 33 to the position, no component such as a spring is necessary to return the steel ball 33 to the initial position. This also serves to reduce the sensor unit 30F in size.

Eighth Embodiment

Figure 17:
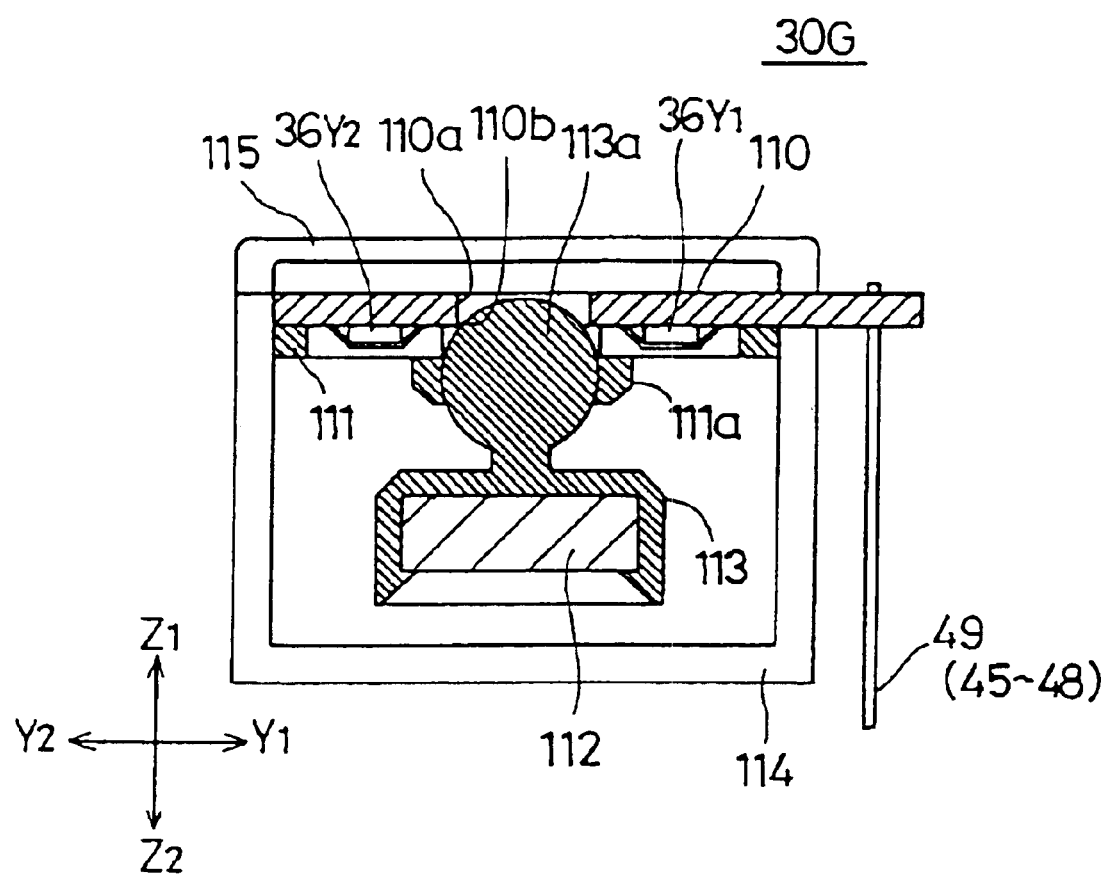
FIG. 17 is a sectional view of a sensor unit according to an eighth embodiment of the present invention.

FIG. 17 is a diagram showing a sensor unit 30G according to an eighth embodiment of the present invention. The sensor unit 30G is of a pendent type.

The sensor unit 30G includes a printed board 110, a bearing plate member 111, a thin cylindrical permanent magnet 112, a hanging member 113, upper and lower cases 114 and 115, and the pin terminals 45 through 49. A circular opening 110a is formed in the center of the printed board 110, and the GaAs Hall elements $36X_1$, $36X_2$, $36Y_1$, and $36Y_2$ are mounted on the lower surface of the printed board 110. The bearing plate member 111 includes an annular holder part 111a and is fixed to the lower surface of the printed board 110. The permanent magnet 112 is magnetized in the $Z_1-Z_2$ direction. The permanent magnet 112 is incorporated into the hanging member 113. The hanging member 113 has a sphere part 113a on its upper end. The hanging member 113 hangs from the bearing plate member 111 with the sphere part 113a being supported by the holder part 111a.

The sphere part 113a is supported by the holder part 111a so as to be freely movable therein with a portion of the sphere part 113a being fitted into the circular opening 110a.

When the sensor unit 30G is inclined, the hanging member 113 is inclined to the printed board 110 by the effects of gravity on the permanent magnet 112, 50 that the permanent magnet 112 changes positions with respect to the GaAs Hall elements $36X_1$, $36X_2$, $36Y_1$, and $36Y_2$. This causes a change in the magnetic field affecting the GaAs Hall elements $36X_1$, $36X_2$, $36Y_1$, and $36Y_2$, so that voltages corresponding to the inclination of the sensor unit 30G are output from the pin terminals 45 and 46.

The displacement of the sphere part 113a in the $Z_1-Z_2$ directions is restricted by a rim 110b of the circular opening 110a of the printed board 110 and the holder part 111a. Therefore, when the sensor unit 30G is subjected to vibration in the $Z_1-Z_2$ directions, the hanging member 113 is displaced together with the printed board 110. Thereby, the permanent magnet 112 is prevented from changing positions with respect to the GaAs Hall elements $36X_1$, $36X_2$, $36Y_1$, and $36Y_2$. Accordingly, even if the sensor unit 30G vibrates in the $Z_1-Z_2$ directions, no output voltages are produced by this vibration. Therefore, the sensor unit 30G has good vibration resistance.

In the configuration of FIG. 17, the permanent magnet 112 may be incorporated into the sphere part 113a with a weight being provided where the permanent magnet 112 is positioned.

Ninth Embodiment

Figure 18:
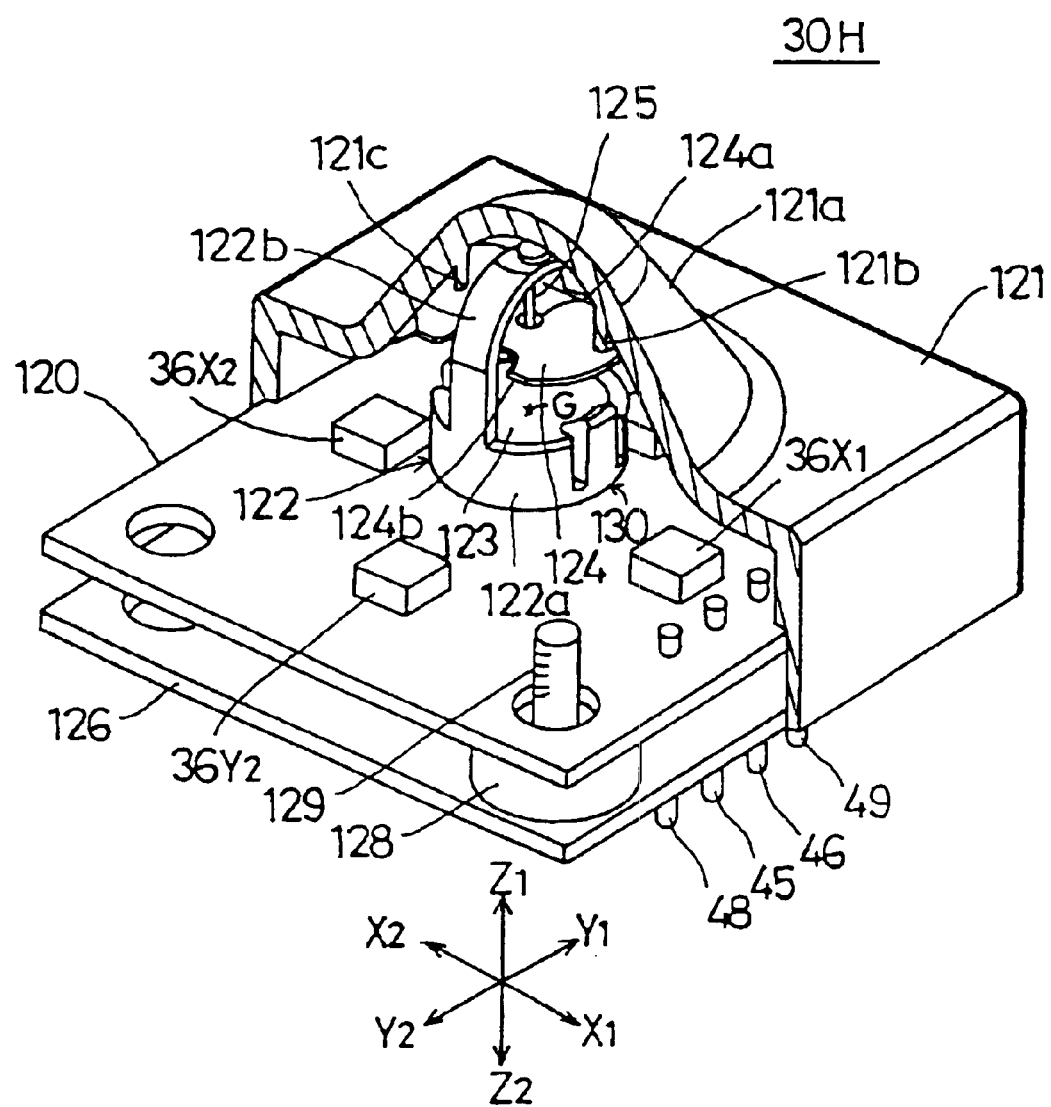
FIG. 18 is a partially exposed perspective view of a sensor unit according to a ninth embodiment of the present invention.
Figure 19:
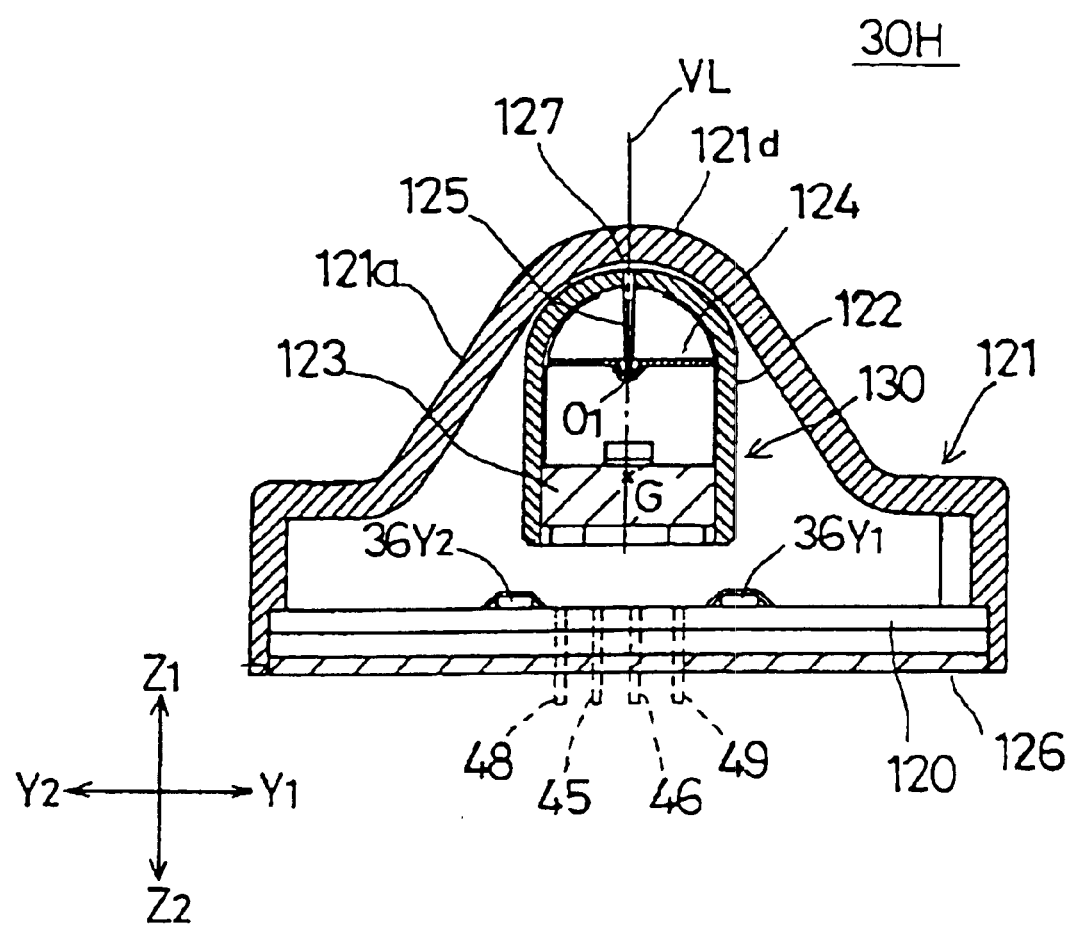
FIG. 19 is a sectional view of the sensor unit of FIG. 18.

FIGS. 18 and 19 are diagrams showing a sensor unit 30H according to a ninth embodiment of the present invention. The sensor unit 30H is of a balancing type.

The sensor unit 30H includes a printed board 120, a case 121, a balancing frame member 122, a thin cylindrical permanent magnet 123, a pivot support plate member 124, a pivot pin member 125, a bottom plate 126, and the pin terminals 45, 46, 48, and 49. The four GaAs Hall elements $36X_1$, $36X_2$, $36Y_1$, and $36Y_2$ are mounted on the upper surface of the printed board 120. The permanent magnet 123 is magnetized in the $Z_1-Z_2$ directions.

The balancing frame member 122 is shaped like a bell and includes a cylindrical part 122a as its lower part and an inversely U-shaped frame part 122b as its upper part. The permanent magnet 123 is incorporated in the cylindrical part 122a. The pivot pin member 125 is fixed downward to the top of the frame part 122b. The frame member 122, and the pivot pin member 125 and the permanent magnet 123 fixed thereto form a balancing assembly 130.

The case 121 includes a substantially conical dome part 121a that accommodates the inversely U-shaped frame part 122b of the balancing frame member 122. Pillar parts 121b and 121c are provided to the inside of the case 121 along the $X_1-X_2$ directions so as to extend in the $Z_2$ direction.

The pivot support plate member 124 has a substantially inversely-conical pivot part 124a formed in the center thereof. The pivot support plate member 124 extends in the $X_1-X_2$ directions with its longitudinal ends fixed to the lower ends of the pillar parts 121b and 121c. A cutout 124b is formed in each of the $Y_1$ and $Y_2$ ends of the pivot support plate member 124 to permit movement of the frame part 122b.

When the balancing assembly 130 is upright in a vertical state with its center being aligned with a vertical line VL of FIG. 19, the center of gravity G of the balancing assembly 130 is on the vertical line VL and positioned below the lower end of the pivot pin member 125 as shown in FIG. 19.

In the balancing assembly 130, the lower end of the pivot pin member 125 is supported by the pivot part 124a of the pivot support plate member 124. The pivot pin member 125 has its lower end contacting the pivot part 124a at a point $O_1$ of FIG. 19. The balancing assembly 130 is stable in a position shown in FIGS. 18 and 19 with its center of gravity G being positioned right below the point $O_1$. The balancing assembly 130 is allowed to pivot 360° about the point $O_1$. The point $O_1$ substantially coincides with the center of the dome part 121a.

The inversely U-shaped frame part 122b is an arc also centered on the point $O_1$. A top part 121d of the dome part 121a has a spherical surface also centered on the point $O_1$. The inversely U-shaped frame part 122b extends along the inner surface of the top part 121d of the dome part 121a. A space 127 is formed between the frame part 122b and the top part 121d of the dome part 121a. Therefore, there is no contact between the frame part 122b and the dome part 121a, so that there is no friction therebetween. Accordingly, when the sensor unit 30H is inclined, the balancing assembly 130 remains stable in the vertical state.

The printed board 120 is incorporated in the case 121. With spacers 128 being interposed between the printed board 120 and the bottom plate 126, screws 129 are screwed from the lower surface of the bottom plate 126 into the case 121 through the bottom plate 126, the spacers 128, and the printed board 120 so that the printed board 120 and the bottom plate 126 are fixed to the case 121. The pin terminals 45, 46, 48, and 49 are fixed to the printed board 120 so as to protrude downward from the bottom plate 126 through the openings of the bottom plate 126. In FIG. 18, only one of the screws 129 and a corresponding one of the spacers 128 are shown for simplicity.

When the sensor unit 30H is inclined, the balancing assembly 130 is inclined relative to the printed board 120 by the weight of the permanent magnet 123. Thereby, the permanent magnet 123 changes positions with respect to the GaAs Hall elements $36X_1$, $36X_2$, $36Y_1$, and $36Y_2$, so that a change is effected in the magnetic field affecting the GaAs Hall elements $36X_1$, $36X_2$, $36Y_1$, and $36Y_2$. Thereby, voltages corresponding to the inclination of the sensor unit 30H are output from the pin terminals 45 and 46.

The sensor unit 30H is reduced in height and is easy to assemble.

The top part 121d of the dome part 121a receives the frame part 122b so as to prevent the balancing assembly 130 from being displaced greatly in the $Z_1$ direction with respect to the case 121. Therefore, such an accident as displacement of the lower end part of the pivot pin member 125 from the pivot part 124a never occurs. Accordingly, the sensor unit 30H has good vibration resistance.

In some cases, a certain period of time is required before the convergence of variations in the output voltages caused by the swing of the balancing assembly 130 occurs, particularly when the sensor unit 30H is inclined abruptly. In order to cope with such cases, the CPU 62 of FIG. 4 may be installed with a program that obtains the averages of the output voltages measured over a certain period of time and employs the obtained averages as an angle of inclination or a program that obtains the average of the maximum and minimum values of each of the output voltages measured over a certain period of time and employs the obtained averages as an angle of inclination. Thereby, the angle of inclination of the sensor unit 30H can be obtained quickly. This configuration may be applicable to any of sensor units 30I through 30L of the following embodiments.

Tenth Embodiment

Figure 20:
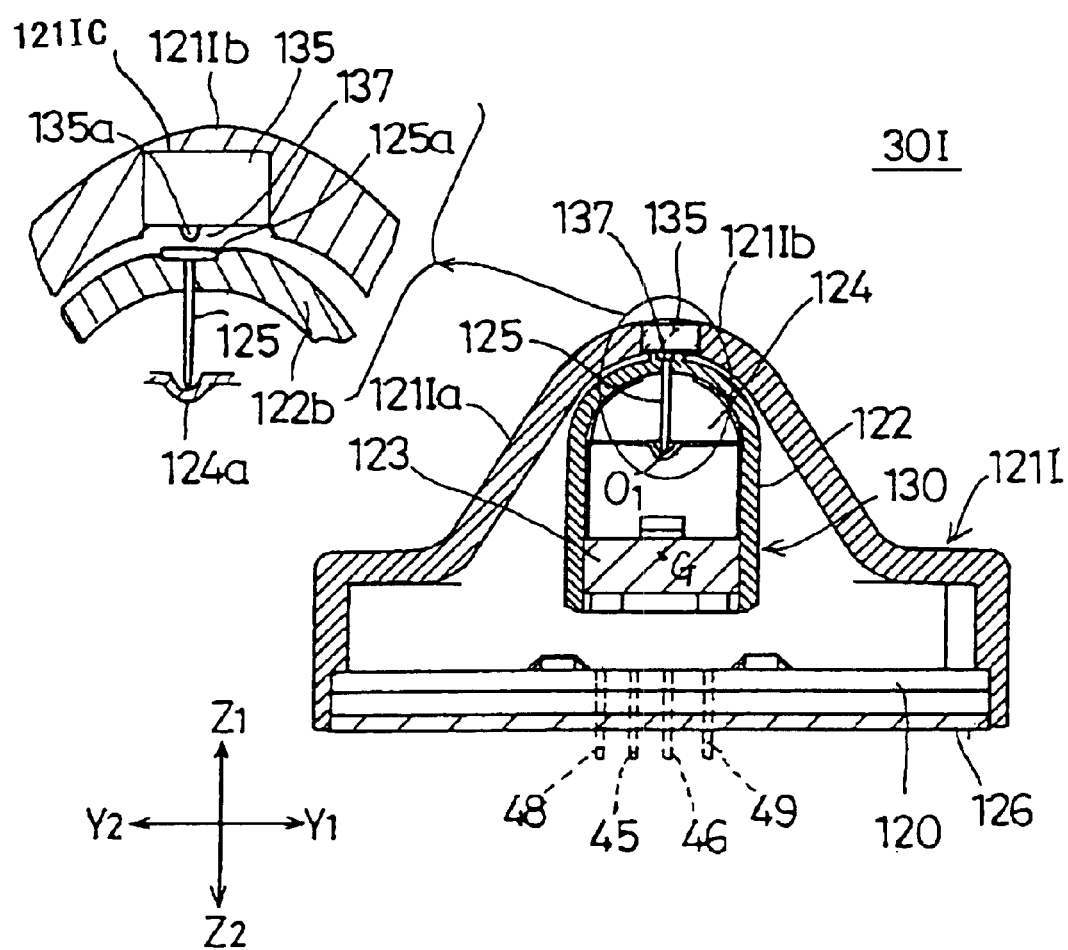
FIG. 20 is a sectional view of a sensor unit according to a tenth embodiment of the present invention.

FIG. 20 is a diagram showing the sensor unit 30I according to a tenth embodiment of the present invention. The sensor unit 30I is of a balancing type.

The sensor unit 30I includes a microswitch 135 in addition to the configuration of the sensor unit H shown in FIGS. 18 and 19. As shown enlarged in FIG. 20, the microswitch 135 is incorporated in a concave part 121Ic formed in a top part 121Ib of a dome part 121Ia so that a pin plunger 135a is exposed inside the dome part 121Ia. A space 137 is formed between a head part 125a of the pivot pin member 125 of the balancing assembly 130 and the pin plunger 135a. Normally, the microswitch 135 is set to OFF. When the balancing assembly 130 is displaced in the $Z_1$ direction, the pin plunger 135a is pressed by the head part 125a so that the microswitch 135 is switched ON. The microswitch 135 serves to make the outputs of the sensor unit 30I invalid when the microswitch 135 detects displacement of the balancing assembly 130 in the $Z_1$ direction.

When the sensor unit 30I is inclined, the balancing assembly 130 swings about the point $O_1$ with the lower end part of the pivot pin member 125 being supported by the pivot part 124a to be inclined relatively to the printed board 120. In such a case, the sensor unit 30I outputs a voltage corresponding to the inclination thereof as shown by a line X in FIG. 21.

Figure 21:
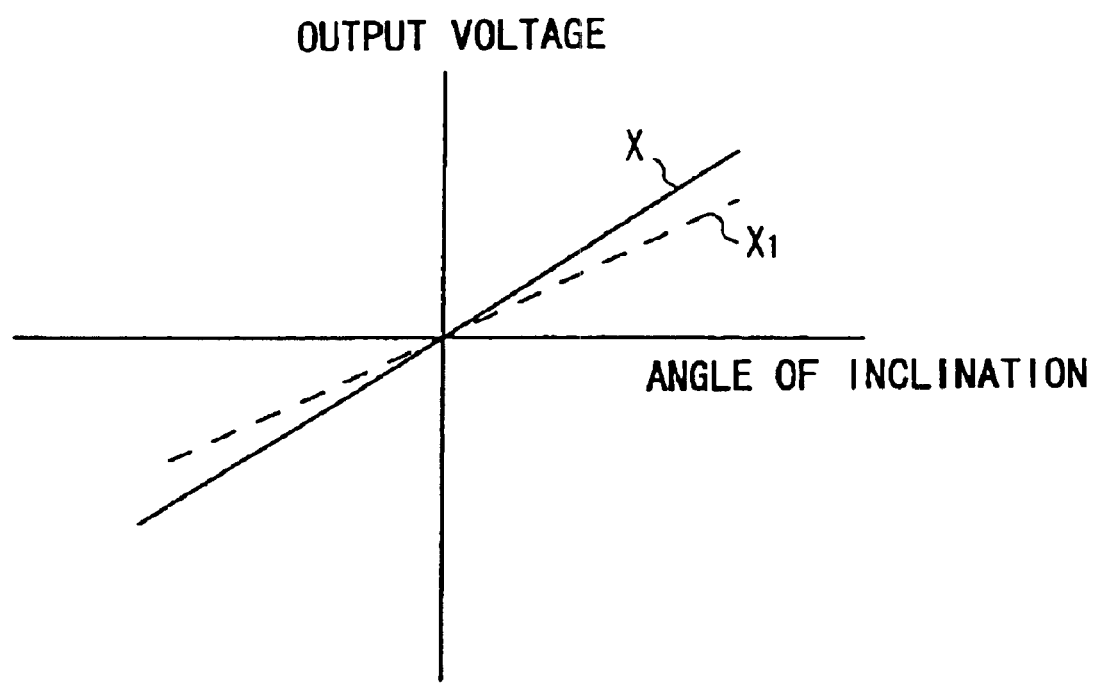
FIG. 21 is a diagram showing a relationship between an angle of inclination and an output voltage when a balancing assembly of the sensor unit of FIG. 20 is in normal and abnormal states.

However, if the balancing assembly 130 is displaced in the $Z_1$ direction to be inclined relatively to the printed board 120 with the lower end part of the pivot pin member 125 being slightly separated from the pivot part 124a, the sensor unit 30I outputs a voltage as shown by a line XI in FIG. 21, which voltage is slightly lower than the correct voltage shown by the line X. Therefore, the accuracy of inclination angle measurement decreases if the data of the line XI is employed.

Therefore, when the balancing assembly 130 is displaced in the $Z_1$ direction to switch the microswitch 135 ON, the outputs of the sensor unit 30I are made invalid. Accordingly, an angle of inclination can be measured with accuracy by the sensor unit 30I.

Another type of detection switch may replace the microswitch 135.

11$^{th}$ Embodiment

Figure 22:
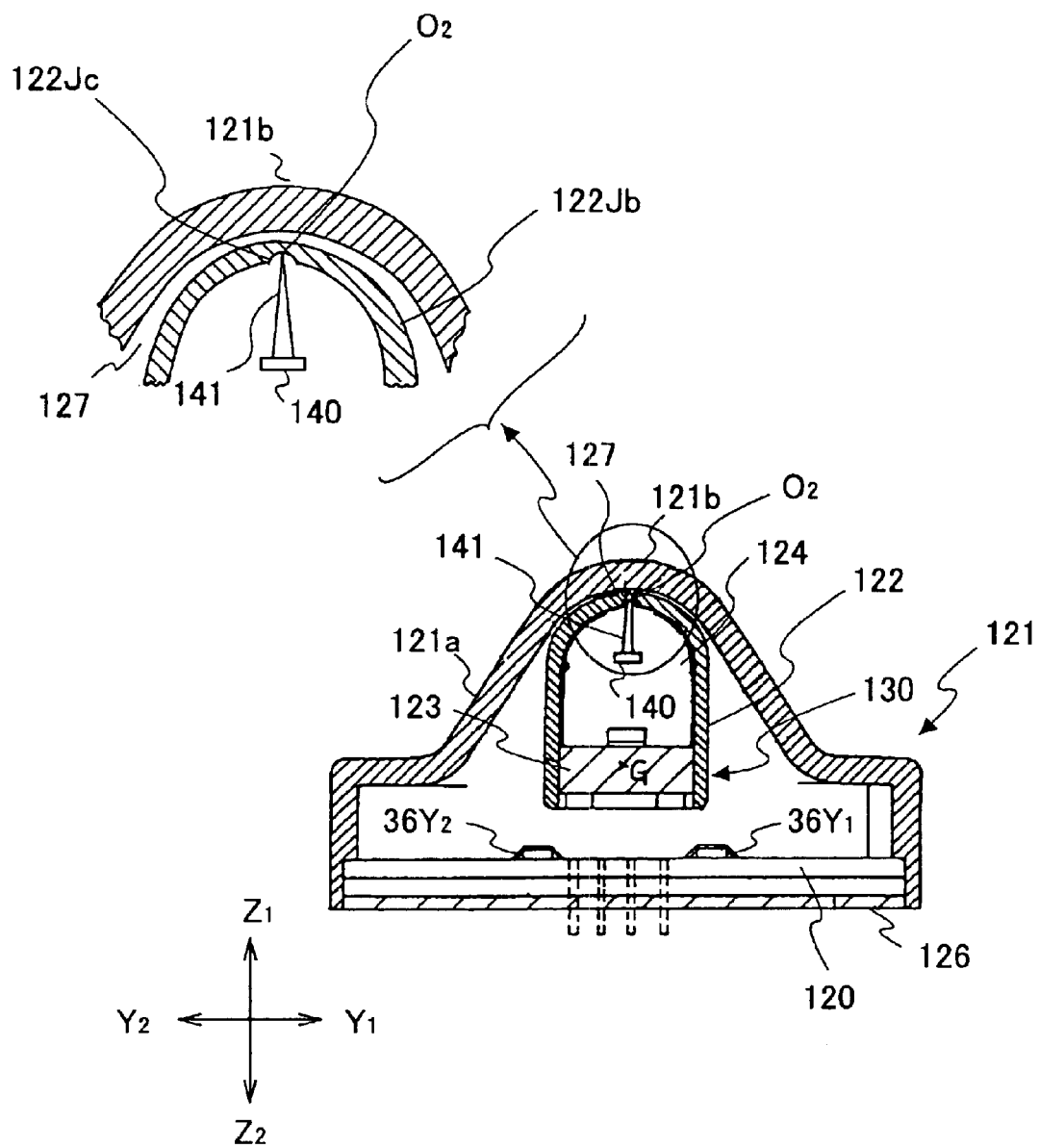
FIG. 22 is a sectional view of a sensor unit according to an $11^{th}$ embodiment of the present invention.

FIG. 22 is a diagram showing the sensor unit 30J according to an 11$^{th}$ embodiment of the present invention. The sensor unit 30J is of a balancing type.

The sensor unit 30J is different from the sensor unit 30H shown in FIGS. 18 and 19 in the way a balancing assembly 130J is supported.

A horizontal rail member 140 extending in the $X_1$–$X_2$ directions is fixed to the inside of the dome part 121a of the case 121. A pin 141 protrudes upward from the rail member 140.

A pivot-receiving part 122Jc is formed on the lower surface of the top part of an inversely U-shaped frame part 122Jb of a balancing assembly 130J.

The pivot-receiving part 122Jc is supported on the tip of the pin 141 so that the balancing assembly 130J swings about a point $O_2$.

12$^{th}$ Embodiment

Figure 23:
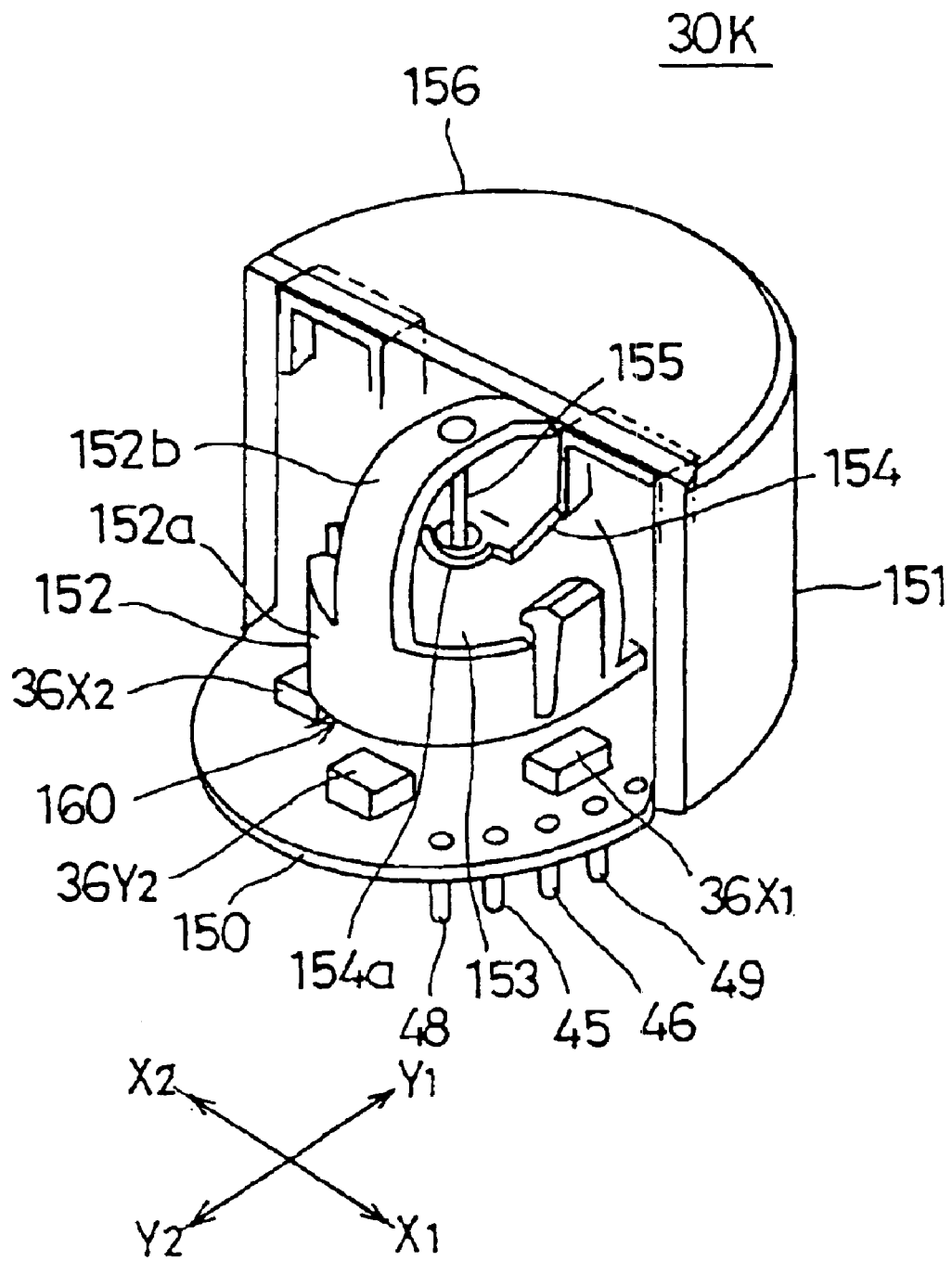
FIG. 23 is a partially exposed perspective view of a sensor unit according to a $12^{th}$ embodiment of the present invention.
Figure 24:
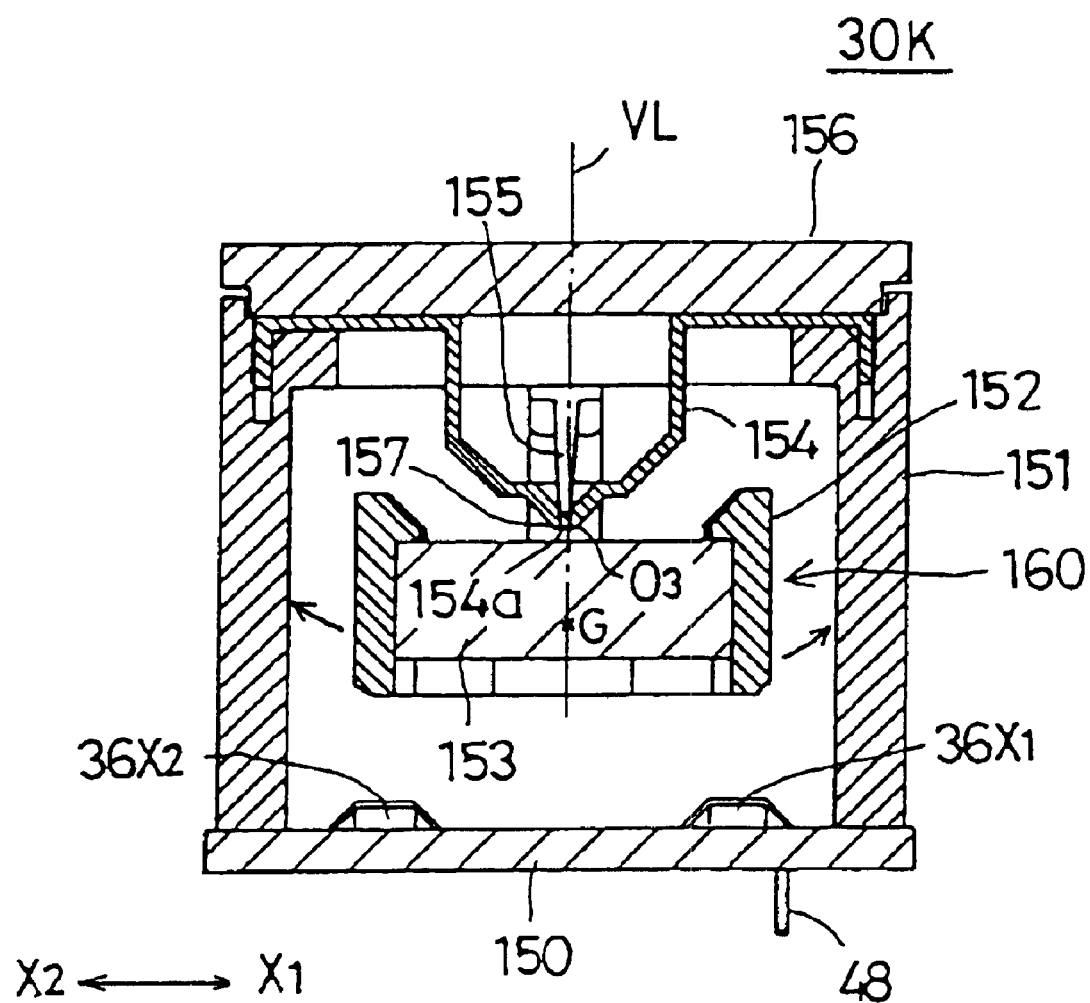
FIG. 24 is a sectional view of the sensor unit of FIG. 23.

FIGS. 23 and 24 are diagrams showing the sensor unit 30K according to a 12$^{th}$ embodiment of the present invention. The sensor unit 30K is of a balancing type.

The sensor unit 30K includes a printed board 150, a cylindrical case 151, a balancing frame member 152, a thin cylindrical permanent magnet 153, a pivot support plate member 154, a pivot pin member 155, a lid plate 156, and the pin terminals 45, 46, 48, and 49. The four GaAs Hall elements $36X_1$, $36X_2$, $36Y_1$, and $36Y_2$ are mounted on the upper surface of the printed board 150. The permanent magnet 153 is magnetized in the $Z_1$–$Z_2$ directions.

The pivot support plate member 154 is substantially U-shaped and fixed to an upper part of the case 151 so as to cross a space inside the case 151 in the $X_1$–$X_2$ directions. A substantially inversely-conical pivot part 154a is formed in the center of the pivot support plate member 154.

The permanent magnet 153 is fixed to the frame member 152. The pivot pin member 155 is fixed downward to the top part of an inversely U-shaped frame part 152b of the frame member 152. The frame member 152, and the pivot pin member 155 and the permanent magnet 153 fixed thereto form a balancing assembly 160.

With the lower end of the pivot pin member 155 being supported by the pivot part 154a, the balancing assembly 160 is stable in a position shown in FIGS. 23 and 24 so as to be allowed to swing about a point $O_3$.

When the sensor unit 30K is inclined, the balancing assembly 160 is inclined to the printed board 150 by the weight of the permanent magnet 153. Therefore, the permanent magnet 153 changes positions with respect to the GaAs Hall elements $36X_1$ $36X_2$, $36Y_1$, and $36Y_2$, so that a change is caused in the magnetic field affecting the GaAs Hall elements $36X_1$, $36X_2$, $36Y_1$, and $36Y_2$. Thereby, voltages corresponding to the inclination of the sensor unit 30K are output from the pin terminals 45 and 46.

A space 157 is formed between the pivot part 154a and the permanent magnet 153. Therefore, displacement of the balancing assembly 160 in the $Z_1$ direction with respect to the case 151 is restricted by contact of the permanent magnet 153 with the pivot part 154a. Thus, even when the sensor unit 30K vibrates in the $Z_1$–$Z_2$ directions, such an accident as displacement of the lower end part of the pivot pin member 155 from the pivot part 154a is prevented from occurring. Accordingly, the sensor unit 30K has good vibration resistance.

13$^{th}$ Embodiment

Figure 25:
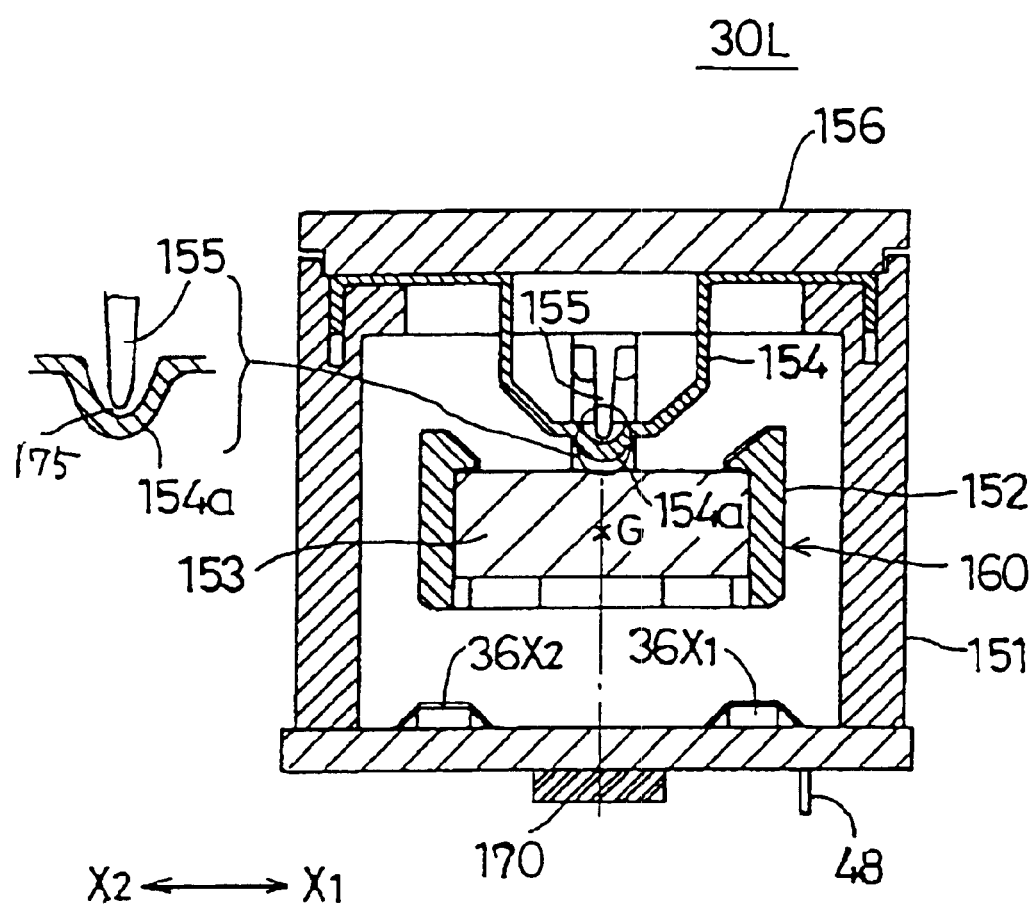
FIG. 25 is a sectional view of a sensor unit according to a $13^{th}$ embodiment of the present invention.

FIG. 25 is a diagram showing the sensor unit 30L according to a 13$^{th}$ embodiment of the present invention. The sensor unit 30L is of a balancing type.

In addition to the configuration of the sensor unit 30K of FIGS. 23 and 24, the sensor unit 30L further includes a permanent magnet 170 fixed to the center of the lower surface of the printed board 150.

The permanent magnet 170 is provided so that the opposing magnetic poles of the permanent magnets 170 and 153 are of the same type. Thereby, a repulsive force is exerted between the permanent magnets 170 and 153. The magnetic force of the permanent magnet 170 is properly determined so that the lower end of the pivot pin member 155 floats slightly over the pivot part 154a. A space 175 is formed by the floatation of the pivot pin member 155. Therefore, the balancing assembly 160 swings without generation of any frictional force between the lower end of the pivot pin member 155 and the pivot part 154a. Accordingly, the balancing assembly 160 is allowed to swing with better sensitivity in the sensor unit 30L than in the sensor unit 30K.

The lower end of the pivot pin member 155 may not float over the pivot part 154a depending on the magnetic force of the permanent magnet 170. Even in such a case, the contact force of the lower end of the pivot pin member 155 on the pivot part 154a is weaker than in the case without the permanent magnet 170. Therefore, the balancing assembly 160 swings with better sensitivity than in the sensor unit 30K.

Installing the CPU 62 of FIG. 4 with the program obtaining the average of each output voltage measured over a certain period of time is especially effective in the case of the sensor unit 30L.

In each of the above-described embodiments, the Hall elements $36X_1$, $36X_2$, $36Y_1$, and $36Y_2$ may be replaced by magnetoresistive elements.

14$^{th}$ Embodiment

Figure 26:
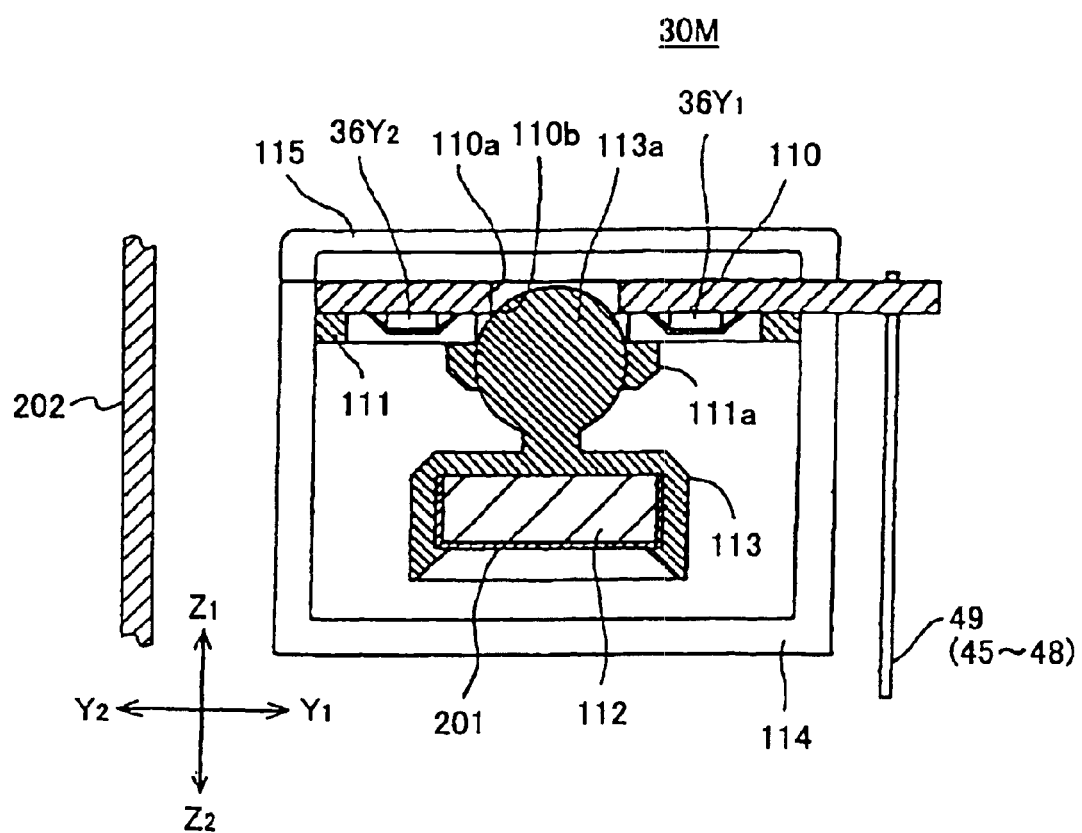
FIG. 26 is a sectional view of a sensor unit according to a 14$^{th}$ embodiment of the present invention.

FIG. 26 is a diagram showing a sensor unit 30M according to a 14$^{th}$ embodiment of the present invention. In FIG. 26, the same elements as those of FIG. 17 are referred to by the same numerals, and a description thereof will be omitted.

In addition to the configuration of the sensor unit 30G, the sensor unit 30M further includes a thin magnetic plate 201 (a magnetic shield member) provided to the lower end side surfaces of the permanent magnet 112.

By providing the thin magnetic plate 201 to the lower and side surfaces of the permanent magnet 112, the lower and side surfaces of the permanent magnet 112 can be magnetically shielded. Thereby, for instance, a shield member 202 provided to a circuit board on which the sensor unit 30M is provided and the permanent magnet 112 are kept from interacting with each other, thus preventing the permanent magnet 112 from being attracted toward the shield member 202, that is, in the $Y_2$ direction.

Accordingly, displacement of the permanent magnet 112 irrespective of inclination can be avoided, so that inclination detection can be performed with accuracy.

15$^{th}$ Embodiment

Figure 27:
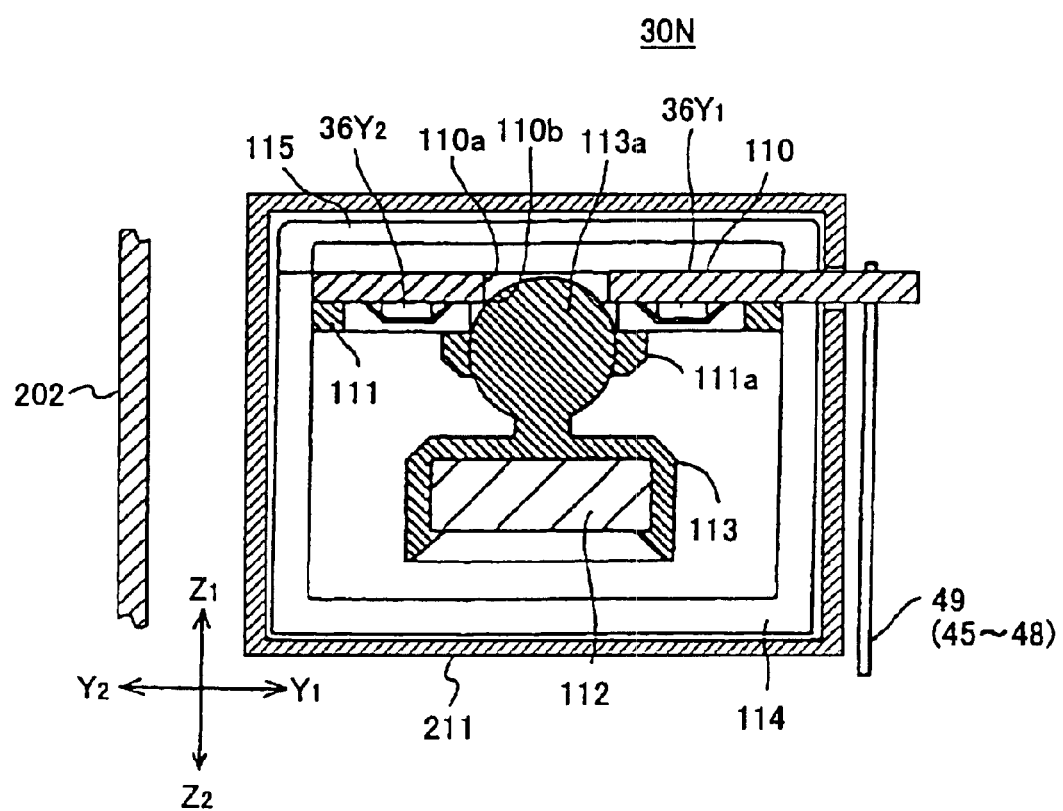
FIG. 27 is a sectional view of a sensor unit according to a 15$^{th}$ embodiment of the present invention.

FIG. 27 is a diagram showing a sensor unit 30N according to a 15$^{th}$ embodiment of the present invention. In FIG. 27, the same elements as those of FIG. 17 are referred to by the same numerals, and a description thereof will be omitted.

In addition to the configuration of the sensor unit 30G of FIG. 17, the sensor unit 30N further includes a thin magnetic plate 211 (a magnetic shield member) covering the outer surfaces of the lower and upper cases 114 and 115.

By covering the outer surfaces of the lower and upper cases 114 and 115 with the thin magnetic plate 211, the permanent magnet 112 can be magnetically shielded. Thereby, for instance, the shield member 202 provided to a circuit board on which the sensor unit 30N is provided and the permanent magnet 112 are kept from interacting with each other, thus preventing the permanent magnet 112 from being attracted toward the shield member 202, that is, in the $Y_2$ direction.

Accordingly, inclination-unrelated displacement of the permanent magnet 112 can be avoided, so that inclination detection can be performed with accuracy.

16$^{th}$ Embodiment

Figure 28:
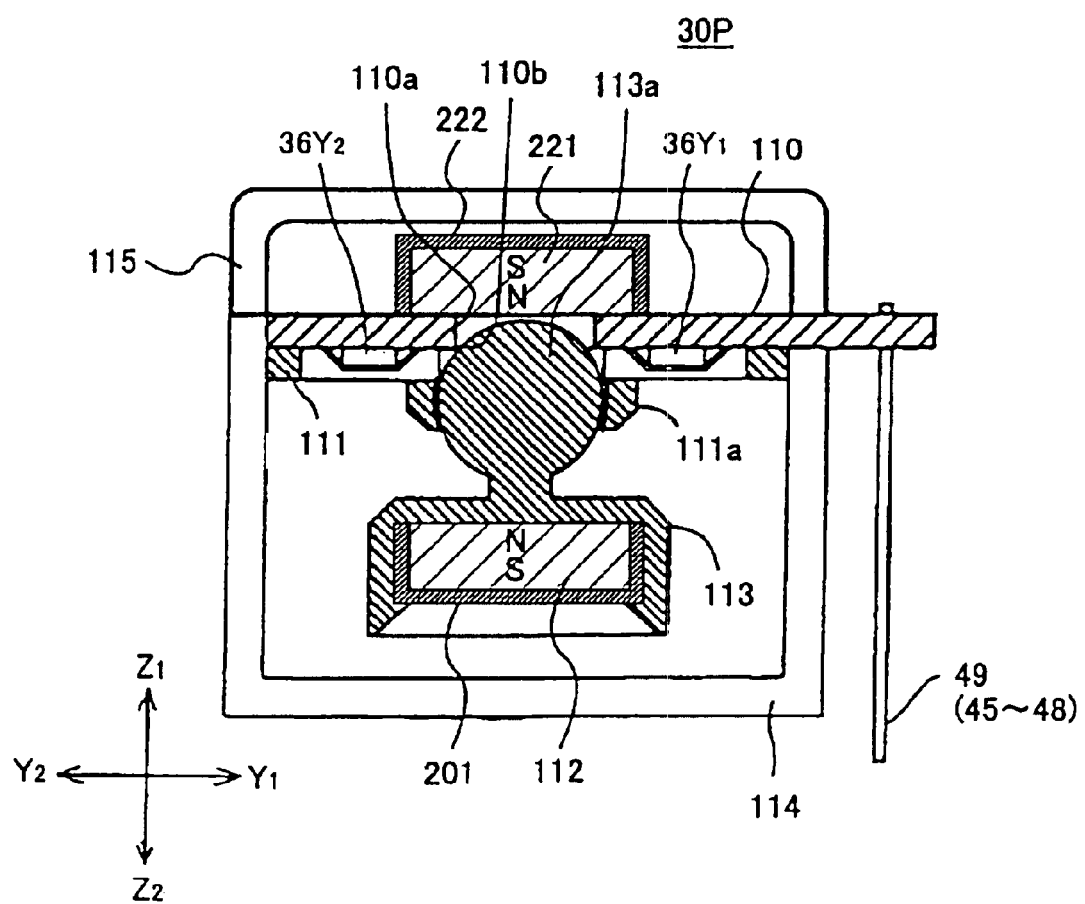
FIG. 28 is a sectional view of a sensor unit according to a 16$^{th}$ embodiment of the present invention.

FIG. 28 is a diagram showing a sensor unit 30P according to a 16$^{th}$ embodiment of the present invention. In FIG. 28, the same elements as those of FIG. 26 are referred to by the same numerals, and a description thereof will be omitted.

In addition to the configuration of the sensor unit 30M of FIG. 26, the sensor unit 30P further includes a permanent magnet 221 (an elastic force application part) provided on the upper surface of the printed board 110 so as to have a magnetic polarity reverse to that of the permanent magnet 112. The upper and side surfaces of the permanent magnet 221 are covered with a thin magnetic plate 222.

The permanent magnets 221 and 112 are provided to have the magnetic polarities reverse to each other so that a force is exerted on the permanent magnet 112 in the $Z_2$ direction. Therefore, the permanent magnet 112 is displaced less easily in the $Y_1$–$Y_2$ directions by inclination, force, or acceleration. Therefore, a greater inclination, force, or acceleration may be detected.

Figure 29:
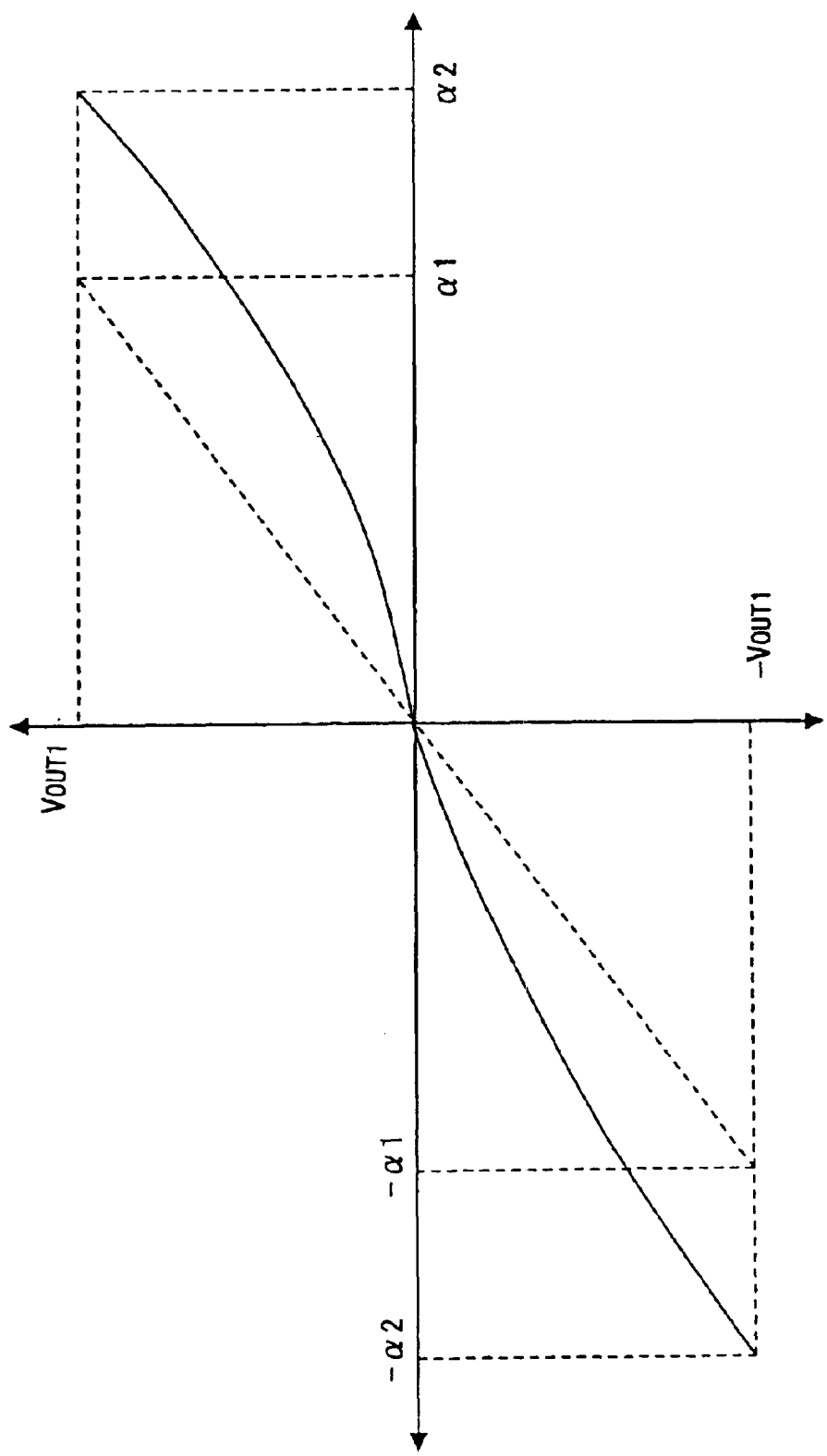
FIG. 29 is a diagram showing a relationship between acceleration and output.

FIG. 29 is a diagram showing a relationship between output and acceleration. In FIG. 29, a solid line shows an output characteristic in the case of employing the permanent magnet 221, and a broken line shows an output characteristic in the case of omitting the permanent magnet 221.

When outputs are in the range of −Vout1 to Vout1, accelerations in the range of −α1 to α1 are measured in the case of omitting the permanent magnet 221. By providing the permanent magnet 221, displacement of the permanent magnet 112 is reduced with respect to acceleration. Therefore, the measurement range of acceleration is enlarged so that accelerations in the range of −α2 to α2 can be measured.

17th Embodiment

Figure 30:
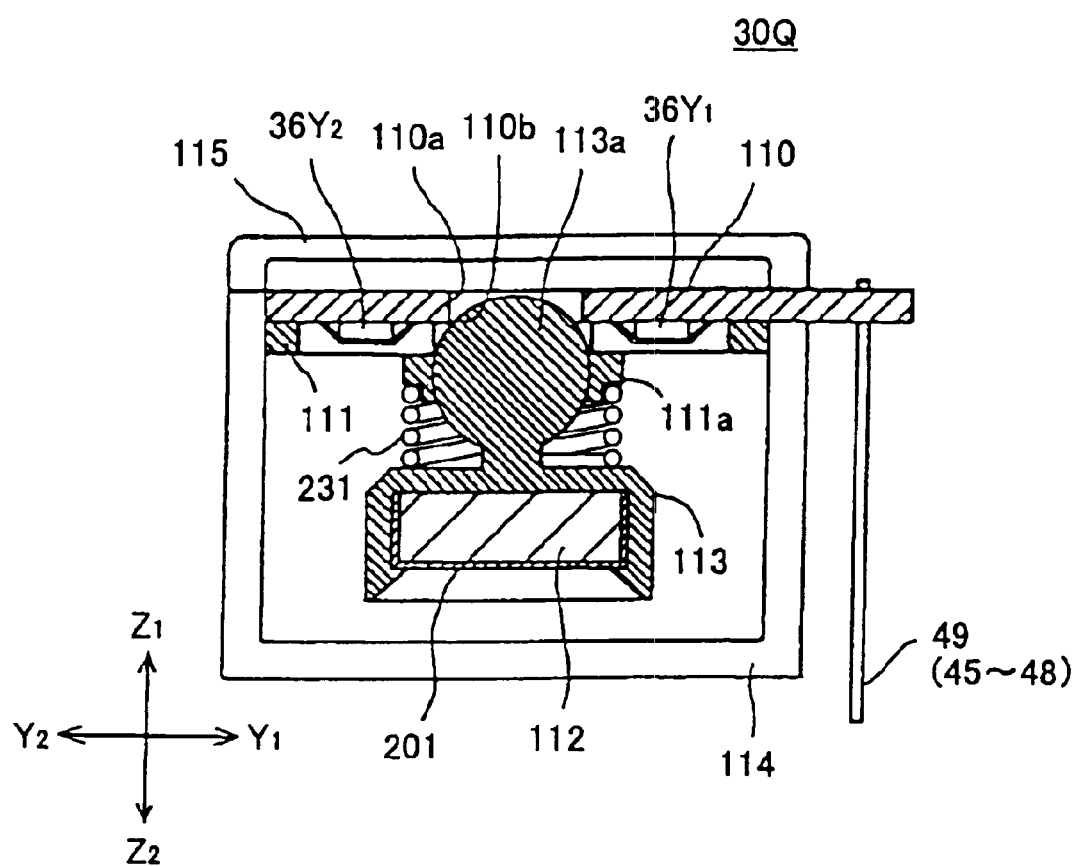
FIG. 30 is a sectional view of a sensor unit according to a 17$^{th}$ embodiment of the present invention.

FIG. 30 is a diagram showing a sensor unit 30Q according to a 17th embodiment of the present invention. In FIG. 30, the same elements as those of FIG. 26 are referred to by the same numerals, and a description thereof will be omitted.

In addition to the configuration of the sensor unit 30M of FIG. 26, the sensor unit 30Q further includes a coil spring 231 provided between the hanging member 113 and the holder part 111a. By providing the coil spring 231 between the hanging member 113 and the holder part 111a, a force is exerted on the hanging member 113 in the $Z_2$ direction. Therefore, the hanging member 113, that is, the permanent magnet 112 is displaced less easily in the $Y_1$–$Y_2$ directions by inclination, force, or acceleration. Thereby, a greater inclination, force, or acceleration may be detected as in the 16th embodiment.

The elastic force application part is not limited to the permanent magnet 221 and the coil spring 231, but may be anything that elastically biases the permanent magnet 112 to its reference position.

18th Embodiment

Figure 31:
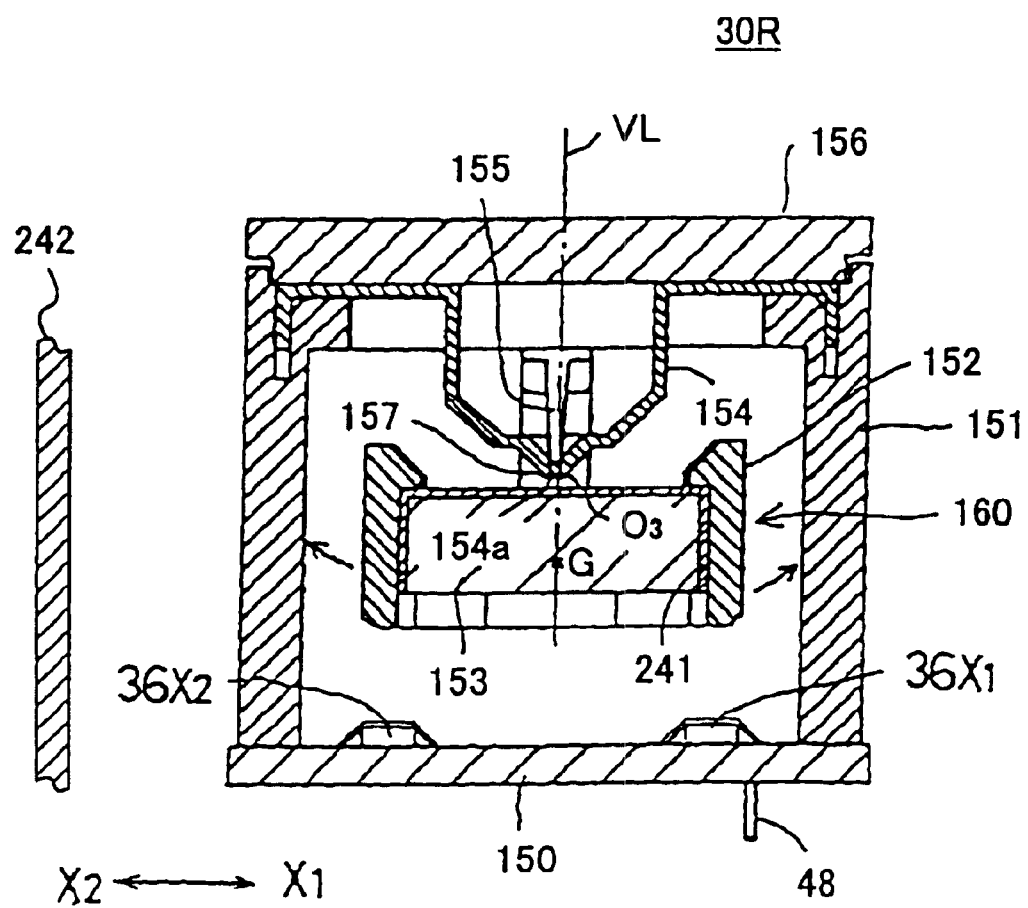
FIG. 31 is a sectional view of a sensor unit according to an 18$^{th}$ embodiment of the present invention.

FIG. 31 is a diagram showing a sensor unit 30R according to an 18th embodiment of the present invention. In FIG. 31, the same elements as those of FIG. 24 are referred to by the same numerals, and a description thereof will be omitted.

In addition to the configuration of the sensor unit 30K of FIG. 24, the sensor unit 30R further includes a thin magnetic plate 241 (a magnetic shield member) provided on the upper and side surfaces of the permanent magnet 153.

By providing the thin magnetic plate 241 on the upper and side surfaces of the permanent magnet 153, the upper and side surfaces of the permanent magnet 153 can be magnetically shielded. Thereby, for instance, a shield member 242 provided to a circuit board on which the sensor unit 30R is provided and the permanent magnet 153 are kept from interacting with each other, thus preventing the permanent magnet 153 from being attracted toward the shield member 242, that is, in the $X_2$ direction.

Accordingly, inclination-unrelated displacement of the permanent magnet 153 can be avoided, so that inclination detection can be performed with accuracy.

19th Embodiment

Figure 32:
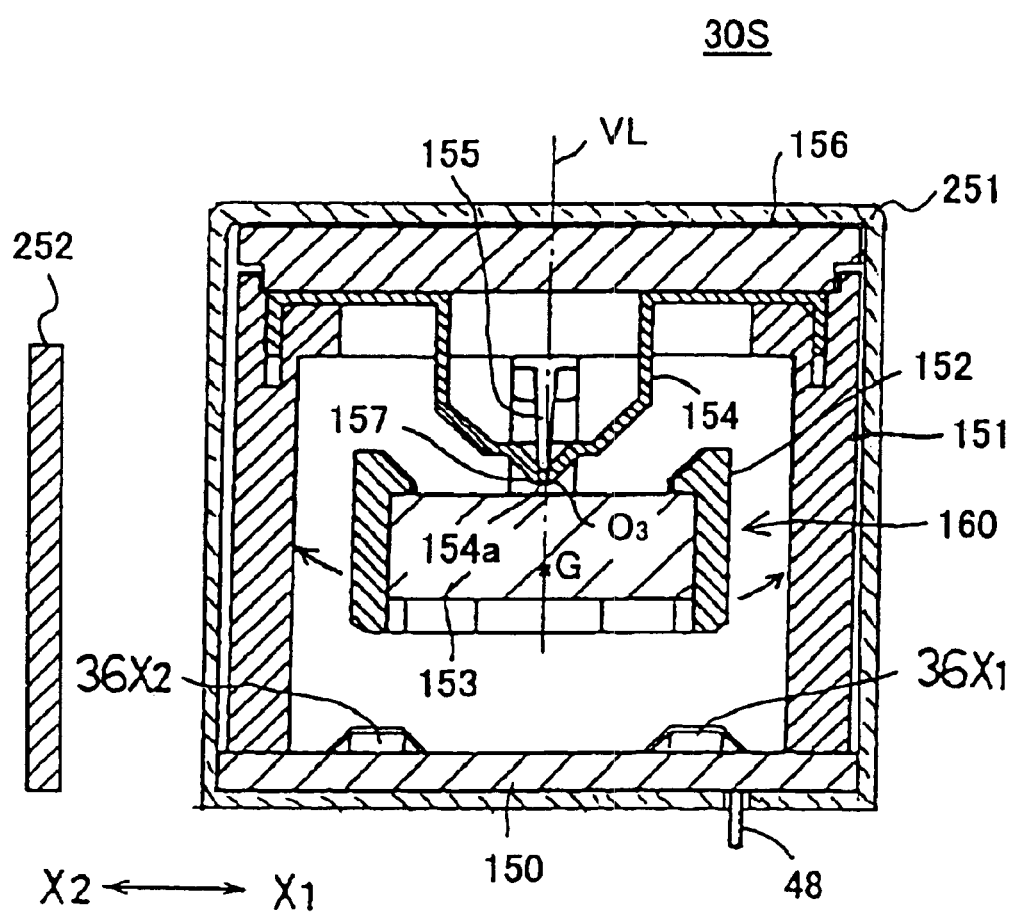
FIG. 32 is a sectional view of a sensor unit according to a 19$^{th}$ embodiment of the present invention.

FIG. 32 is a diagram showing a sensor unit 30S according to a 19th embodiment of the present invention. In FIG. 32, the same elements as those of FIG. 24 are referred to by the same numerals, and a description thereof will be omitted.

In addition to the configuration of the sensor unit 30K of FIG. 24, the sensor unit 30S further includes a thin magnetic plate 251 (a magnetic shield member) covering the outer surfaces of the printed board 150, the case 151, and the lid plate 156.

By covering the outer surfaces of the printed board 150, the case 151, and the lid plate 156, the permanent magnet 153 can be magnetically shielded. Thereby, for instance, a shield member 252 provided to a circuit board on which the sensor unit 30S is provided and the permanent magnet 153 are kept from interacting with each other, thus preventing the permanent magnet 153 from being attracted toward the shield member 252, that is, in the $X_2$ direction.

Accordingly, inclination-unrelated displacement of the permanent magnet 153 can be avoided, so that inclination detection can be performed with accuracy.

20th Embodiment

Figure 33:
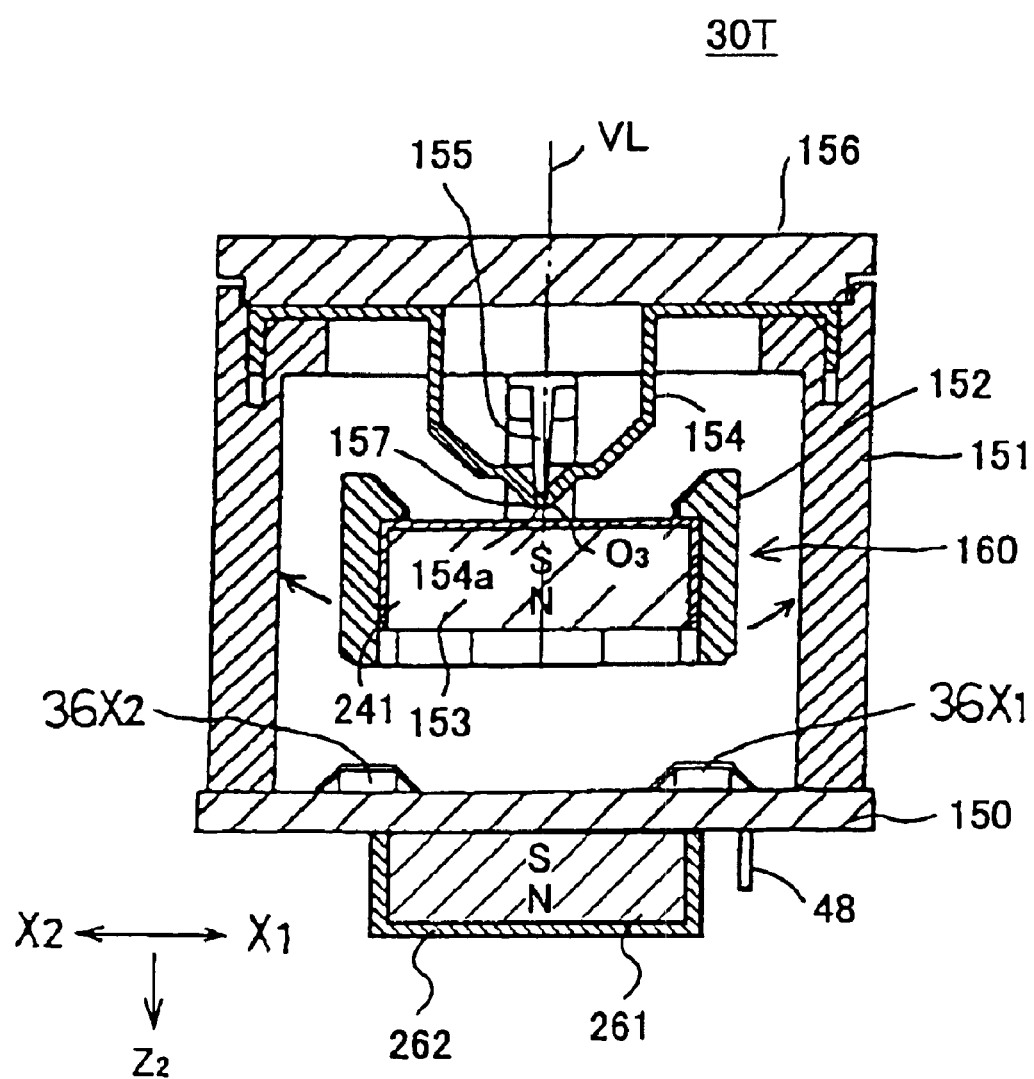
FIG. 33 is a sectional view of a sensor unit according to a 20$^{th}$ embodiment of the present invention.

FIG. 33 is a diagram showing a sensor unit 30T according to a 20th embodiment of the present invention. In FIG. 33, the same elements as those of FIG. 31 are referred to by the same numerals, and a description thereof will be omitted.

In addition to the configuration of the sensor unit 30R of FIG. 31, the sensor unit 30T further includes a permanent magnet 261 (an elastic force application part) provided to the lower surface of the printed board 150. The permanent magnet 261 is provided to have the same magnetic polarity as the permanent magnet 153 in the $Z_1$–$Z_2$ directions. The lower and side surfaces of the permanent magnet 261 are covered with a thin magnetic plate 262.

Since the permanent magnets 261 and 153 are provided to have the same magnetic polarity in the $Z_1$–$Z_2$ directions, the permanent magnets 261 and 153 are attracted to each other so that the permanent magnet 153 is attracted in the $Z_2$ direction. Therefore, the permanent magnet 153 is displaced less easily in the $X_1$–$X_2$ directions by inclination, force, or attraction. Thereby, a greater inclination, force, or acceleration may be detected as in the 16th embodiment.

21st Embodiment

Figure 34:
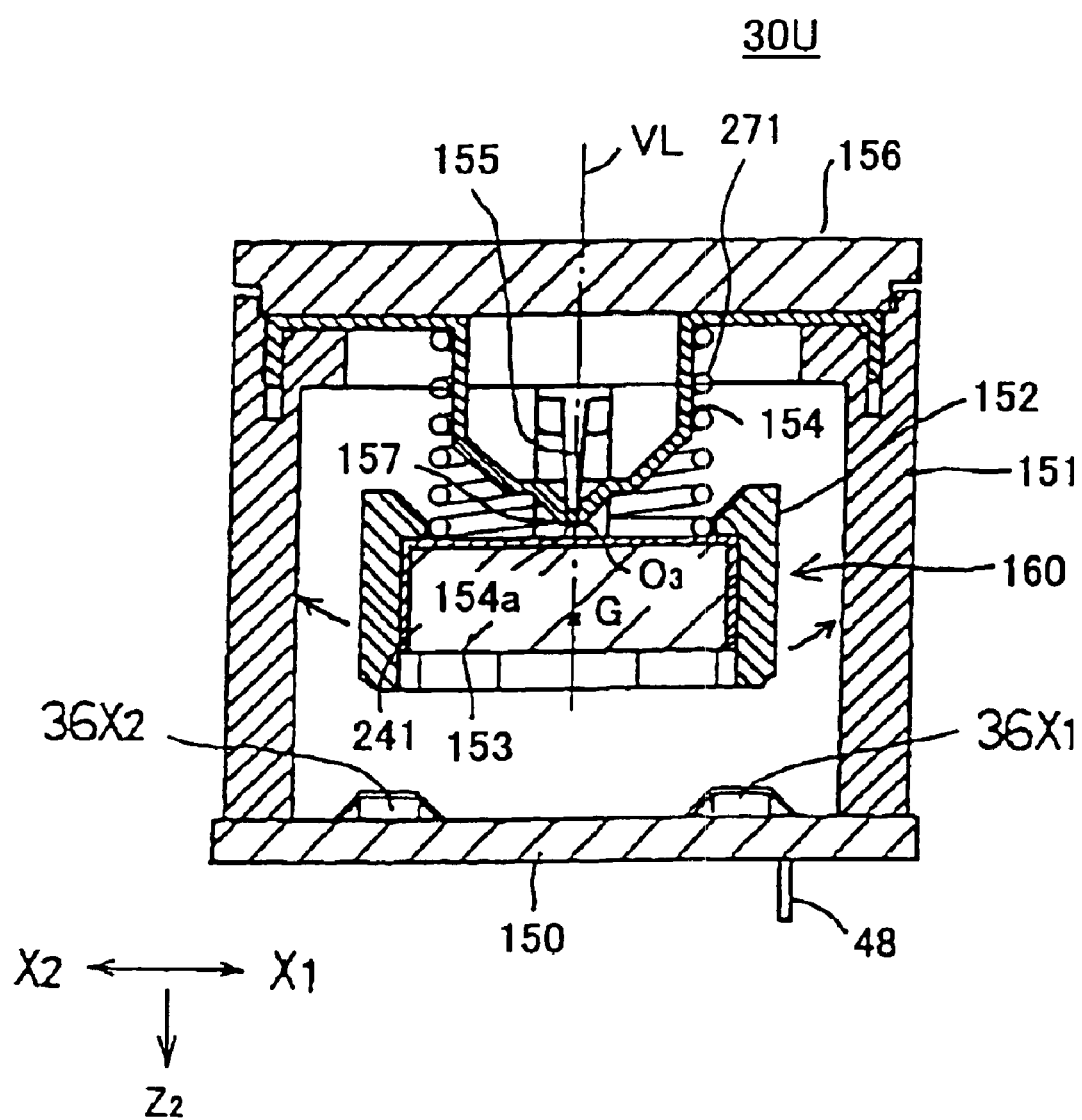
FIG. 34 is a sectional view of a sensor unit according to a 21$^{st}$ embodiment of the present invention.

FIG. 34 is a diagram showing a sensor unit 30U according to a 21st embodiment of the present invention. In FIG. 34, the same elements as those of FIG. 31 are referred to by the same numerals, and a description thereof will be omitted.

In addition to the configuration of the sensor unit 30R of FIG. 31, the sensor unit 30U further includes a coil spring 271 (an elastic member) provided between the pivot support plate member 154 and the balancing frame member 152.

By providing the coil spring 271 between the pivot support plate member 154 and the balancing frame member 152, a force is exerted on the balancing frame member 152 in the $Z_2$ direction. Therefore, the balancing frame member 152 is displaced less easily in the $X_1$–$X_2$ directions by inclination, force, or acceleration. Thereby, a greater inclination, force, or acceleration may be detected as in the 20th embodiment.

22nd Embodiment

Figure 35:
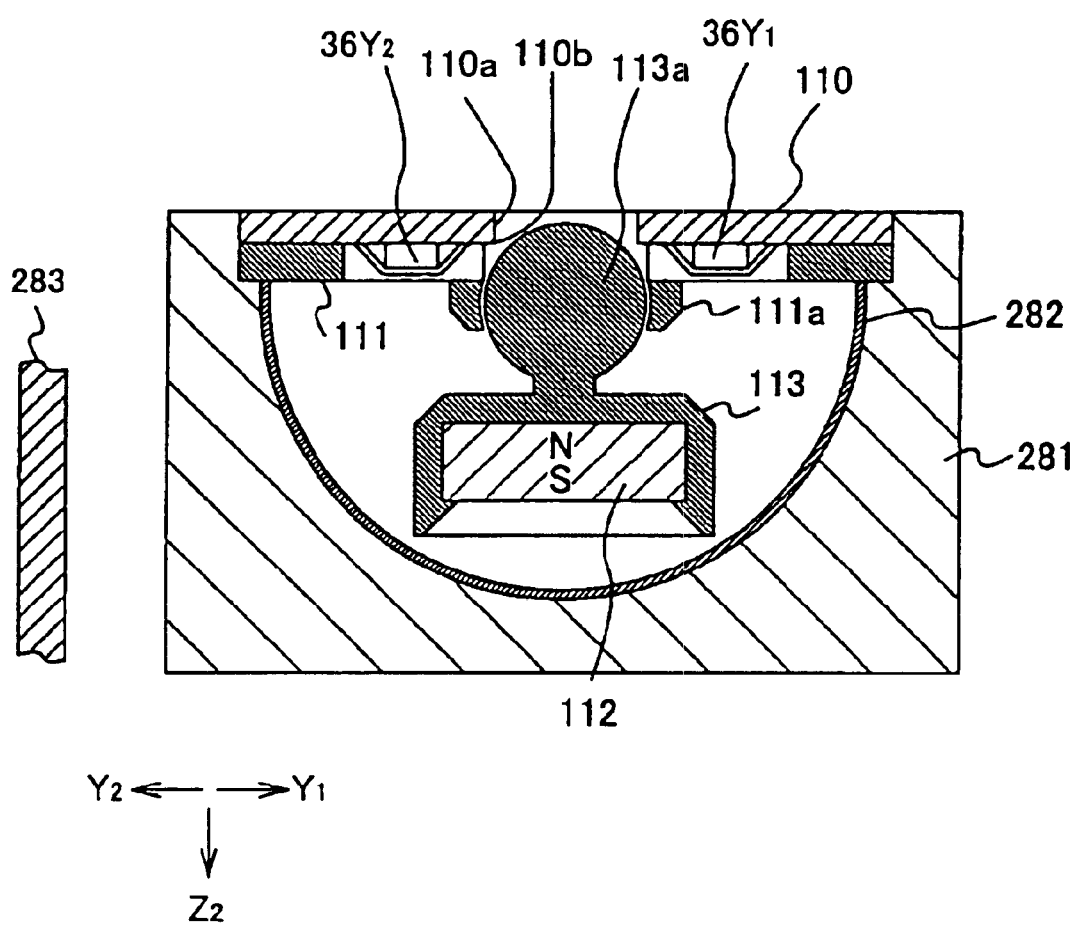
FIG. 35 is a sectional view of a sensor unit according to a 22$^{nd}$ embodiment of the present invention.

FIG. 35 is a diagram showing a sensor unit 30V according to a 22nd embodiment of the present invention. In FIG. 35, the same elements as those of FIG. 17 are referred to by the same numerals, and a description thereof will be omitted.

The sensor unit 30V is different from the sensor unit 30G of FIG. 17 in the shape of the case. A hemispherical concave part is formed in a case 281 of the sensor unit 30V. That is, the case 281 has a spherical internal surface centered on the pivot (swing) center of the hanging member 113. Therefore, the pivot (swing) range of the hanging member 113 can be enlarged.

A thin magnetic film 282 (a magnetic shield member) is formed on the internal surface (the surface of the hemispherical concave part) of the case 281. The thin magnetic film 282 magnetically shields the permanent magnet 112. By magnetically shielding the permanent magnet 112, for instance, a shield member 283 provided to a circuit board on which the sensor unit 30V is provided and the permanent magnet 112 are kept from interacting with each other, thus preventing the permanent magnet 112 from being attracted toward the shield member 283, that is, in the $Y_2$ direction.

23$^{rd}$ Embodiment

Figure 36:
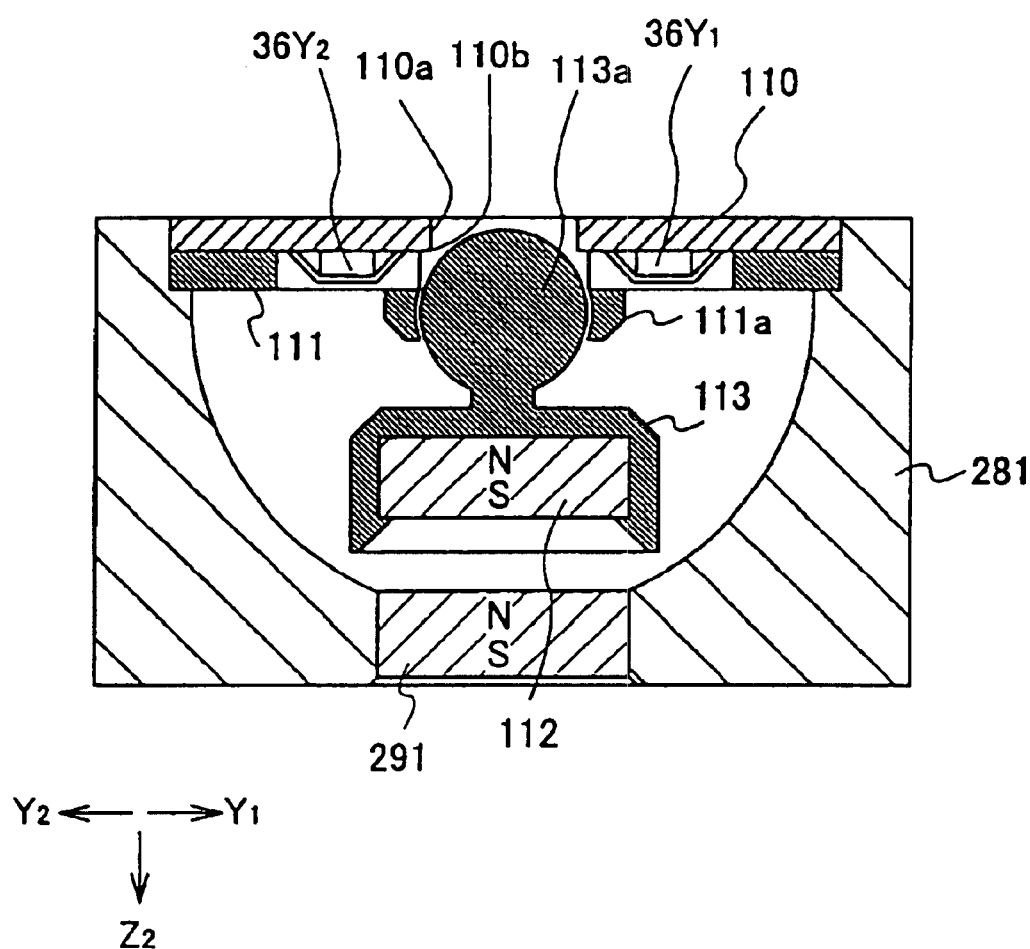
FIG. 36 is a sectional view of a sensor unit according to a 23$^{rd}$ embodiment of the present invention.

FIG. 36 is a diagram showing a sensor unit 30W according to a 23$^{rd}$ embodiment of the present invention. In FIG. 36, the same elements as those of FIG. 35 are referred to by the same numerals, and a description thereof will be omitted.

In addition to the configuration of the sensor unit 30V of FIG. 35, the sensor unit 30W further includes a permanent magnet 291 (an elastic force application part) provided to the bottom of the case 281.

The permanent magnets 291 and 112 are provided to have the same magnetic polarity in the $Z_1$–$Z_2$ directions so as to be attracted to each other. Thereby, the permanent magnet 112 is attracted in the $Z_2$ direction. Therefore, the permanent magnet 112 is displaced less easily in the $Y_1$–$Y_2$ directions by inclination, force, or acceleration. Since displacement of the hanging member 113 (a swingable part) with respect to acceleration is reduced by providing elastic force thereto as in the 16$^{th}$ embodiment, the detectable range of acceleration can be enlarged.

24$^{th}$ Embodiment

Figure 37:
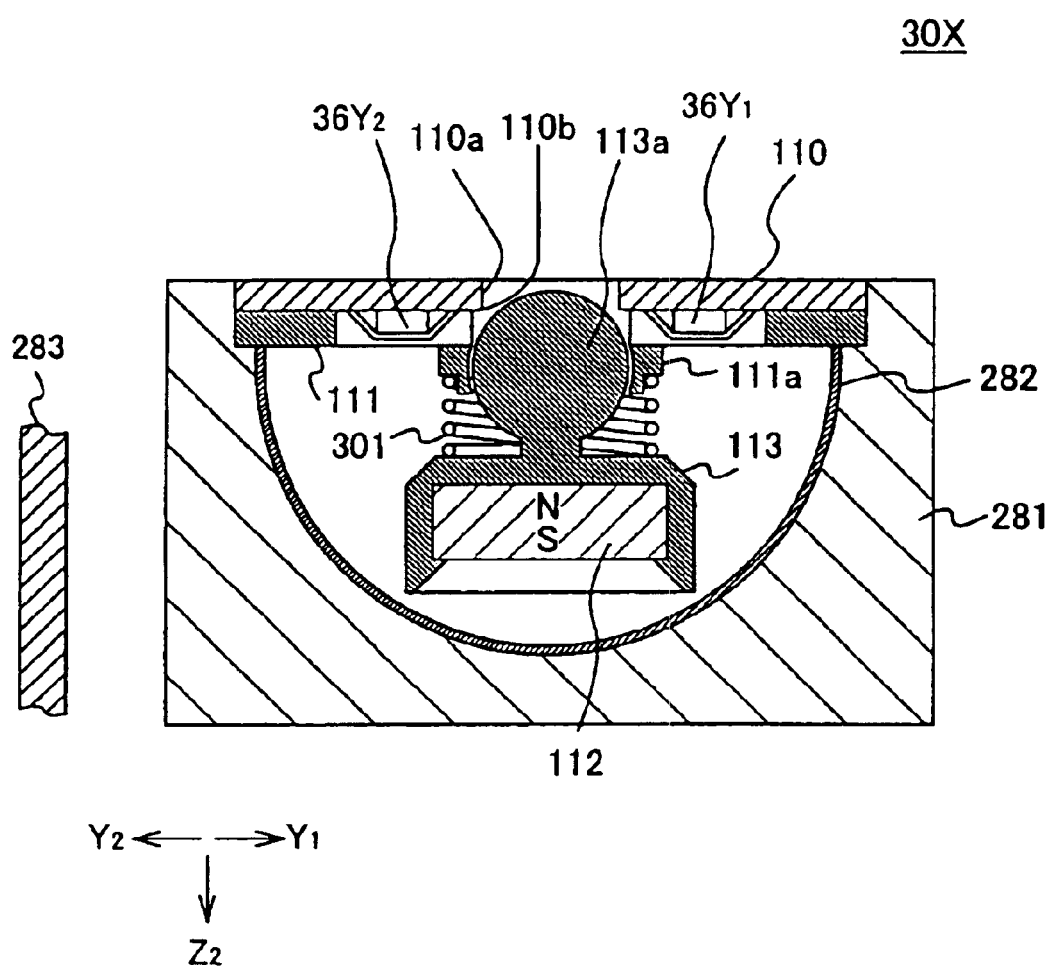
FIG. 37 is a sectional view of a sensor unit according to a 24$^{th}$ embodiment of the present invention.

FIG. 37 is a diagram showing a sensor unit 30X according to a 24$^{th}$ embodiment of the present invention. In FIG. 37, the same elements as those of FIG. 35 are referred to by the same numerals, and a description thereof will be omitted.

In addition to the configuration of the sensor unit 30V of FIG. 35, the sensor unit 30X further includes a coil spring 301 (an elastic member) provided between the hanging member 113 and the holder part 111a.

By providing the coil spring 301 between the hanging member 113 and the holder part 111a, a force is exerted on the hanging member 113 in the $Z_2$ direction. Therefore, the hanging member 113 is displaced less easily in the $Y_1$–$Y_2$ directions by inclination, force, or acceleration. Thereby, a greater inclination, force, or acceleration can be detected as in the 16$^{th}$ embodiment. Further, by forming the thin magnetic film 282 on the internal surface (the surface of the hemispherical concave part) of the case 281, the permanent magnet 112 can be magnetically shielded with a constant distance being maintained between the permanent magnet 112 and the thin magnetic film 282.

The present invention is not limited to the specifically disclosed embodiments, but variations and modifications may be made without departing from the scope of the present invention.

The present application is based on Japanese priority applications No. 2001-110513 filed on Apr. 9, 2001 and No. 2002-2251 filed on Jan. 9, 2002, the entire contents of which are hereby incorporated by reference.

What is claimed is:

1. A sensor unit, comprising:
   a case;
   a printed board affixed to the case and having a magnetic sensor thereon;
   a hanging member including a permanent magnet producing a magnetic field; and
   a hanging and support mechanism, affixed to the case, that supports said hanging member in said case so that said hanging member is pivotable about a single fixed point on the hanging and support mechanism, in every plane rotatable about a vertical axis including the single fixed point, and restricted in displacement in a vertical direction,
   wherein the magnetic sensor detects a change in the magnetic field, caused by a movement of the permanent magnet due to the displacement of said hanging member, and produces a corresponding output.

2. The sensor unit as claimed in claim 1, wherein the magnetic sensor comprises a plurality of Hall elements.

3. The sensor unit as claimed in claim 1, further comprising a magnetic shield member magnetically shielding part of the permanent magnet.

4. The sensor unit as claimed in claim 3, wherein said magnetic shield member is a thin magnetic plate.

5. The sensor unit as claimed in claim 1, further comprising a magnetic shield member magnetically shielding outside surfaces of the sensor unit.

6. The sensor unit as claimed in claim 5, wherein said magnetic shield member is a thin magnetic plate.

7. The sensor unit as claimed in claim 1, further comprising a magnetic material,
   wherein said case has a spherical internal surface substantially centered on a pivot center of said hanging member; and
   said magnetic material is provided to the internal surface or external surfaces of said case.

8. The sensor unit as claimed in claim 1, further comprising an elastic force application part that applies an elastic force to said hanging member.

9. The sensor unit as claimed in claim 8, wherein said elastic force application part applies the elastic force to said hanging member by magnetically interacting with the permanent magnet.

10. The sensor unit as claimed in claim 9, wherein said elastic force application part is a permanent magnet.

11. The sensor unit as claimed in claim 8, wherein said elastic force application part comprises an elastic member that applies the elastic force to said hanging member.

12. The sensor unit as claimed in claim 11, wherein said elastic member is a coil spring.

13. A sensor unit, comprising:
   a case;
   a printed board having a magnetic sensor thereon;
   a balancing assembly having a permanent magnet producing a magnetic field; and
   a pivot support mechanism, affixed to the case, that supports said balancing assembly in said case so that said balancing assembly is pivotable about a single fixed point on the pivot support mechanism, in every plane rotatable about a vertical axis including the single fixed point, wherein the magnetic sensor detects a change in the magnetic field caused by a movement of the permanent magnet, due to the displacement of said balancing assembly with respect to said printed board, and produces a corresponding output.

14. The sensor unit as claimed in claim 13, wherein the magnetic sensor comprises a plurality of Hall elements.

15. The sensor unit as claimed in claim 13, wherein said case covers said balancing assembly;

an internal surface of said case and a top part of said balancing assembly oppose each other with a space being formed therebetween; and said case restricts an upward displacement of said balancing assembly.

16. The sensor unit as claimed in claim 13, further comprising a detection switch provided in said case so as to oppose the top part of said balancing assembly, wherein said detection switch detects an upward displacement of said balancing assembly to make the output of the sensor unit invalid.

17. The sensor unit as claimed in claim 13, further comprising a part that affects the permanent magnet of said balancing assembly so that a flotation force is magnetically exerted on said balancing assembly.

18. The sensor unit as claimed in claim 17, wherein said part is a permanent magnet.

19. The sensor unit as claimed in claim 13, further comprising a magnetic shield member magnetically shielding a part of the permanent magnet.

20. The sensor unit as claimed in claim 19, wherein said magnetic shield member is a thin magnetic plate.

21. The sensor unit as claimed in claim 13, further comprising a magnetic shield member magnetically shielding outside surfaces of the sensor unit.

22. The sensor unit as claimed in claim 21, wherein said magnetic shield member is a thin magnetic plate.

23. The sensor unit as claimed in claim 13, further comprising an elastic force application part that applies elastic force to said balancing assembly.

24. The sensor unit as claimed in claim 23, wherein said elastic force application part applies the elastic force to said balancing assembly by magnetically interacting with the permanent magnet.

25. The sensor unit as claimed in claim 24, wherein said elastic force application part is a permanent magnet.

26. The sensor unit as claimed in claim 23, wherein said elastic force application part comprises an elastic member that applies the elastic force to said balancing assembly.

27. The sensor unit as claimed in claim 26, wherein said elastic member is a coil spring.

28. A sensor unit, comprising:

a pivot part including a pivotable magnet, the pivot part being pivotable about a single fixed point on the sensor unit in every plane rotatable about a vertical axis including the single fixed point;

electromagnetic transducers detecting a magnetic field of the magnet; and a magnetic shield member shutting off a magnetic effect on the magnet.

29. The sensor unit as claimed in claim 28, wherein said magnetic shield member is provided to said swing part.

30. The sensor unit as claimed in claim 29, wherein said magnetic member covers surfaces of the magnet other than a surface thereof opposing said electromagnetic transducers.

31. The sensor unit as claimed in claim 28, wherein said magnetic shield member covers the entire sensor unit.

32. The sensor unit as claimed in claim 28, wherein said magnetic shield member is a thin magnetic plate.

33. A sensor unit, comprising:

a pivot part including a pivotable magnet, the pivot part being pivotable about a single fixed point on the sensor unit, in every plane rotatable about a vertical axis including the single fixed point;

electromagnetic transducers detecting a magnetic field of the magnet;

a case having a spherical internal surface substantially centered on a pivot center of said pivot part and accommodating said pivot part; and a magnetic shield member on the spherical internal surface of said case.

34. A sensor unit, comprising:

a pivot part including a pivotable magnet, the pivot part being pivotable about a single fixed point on the sensor unit, in every plane rotatable about a vertical axis including the single fixed point;

electromagnetic transducers detecting a magnetic field of the magnet;

a case accommodating said pivot part; and an elastic force application part applying an elastic force to said pivot part.

35. The sensor unit as claimed in claim 34, wherein said elastic force application part applies the elastic force to said swing part by magnetically interacting with the magnet.

36. The sensor unit as claimed in claim 35, wherein said elastic force application part is a permanent magnet.

37. The sensor unit as claimed in claim 34, wherein said elastic force application part comprises an elastic member that applies the elastic force to said pivot part.

38. The sensor unit as claimed in claim 37, wherein said elastic member is a coil spring.

39. A sensor unit, comprising:

a case;

a printed board affixed to said case and having a magnetic sensor thereon;

a holding member holding a permanent magnet producing a magnetic field; and a support mechanism, affixed to said case, that supports said holding member in said case so that said holding member is pivotable about a single fixed point on the support mechanism, in every plane rotatable about a vertical axis including the single fixed point, and restricted in displacement in a vertical direction, wherein the magnetic sensor detects a change in the magnetic field, caused by a movement of the permanent magnet due to the displacement of said holding member, and produces a corresponding output.

* * * * *

UNITED STATES PATENT AND TRADEMARK OFFICE
CERTIFICATE OF CORRECTION

PATENT NO.     : 6,826,844 B2                                           Page 1 of 1
DATED          : December 7, 2004
INVENTOR(S)    : Michiko Endo et al.

It is certified that error appears in the above-identified patent and that said Letters Patent is hereby corrected as shown below:

<u>Column 24,</u>
Lines 2, and 34, change "swing" to -- pivot --

Signed and Sealed this

Fourteenth Day of June, 2005

JON W. DUDAS
*Director of the United States Patent and Trademark Office*